United States Patent
Bench et al.

(10) Patent No.: US 12,210,130 B1
(45) Date of Patent: Jan. 28, 2025

(54) ELECTROMAGNETIC MARKER DEVICES FOR BURIED OR HIDDEN USE

(71) Applicant: SeeScan, Inc., San Diego, CA (US)

(72) Inventors: Stephanie M. Bench, Atlanta, GA (US); Mark S. Olsson, La Jolla, CA (US); Matthew D. Bockman, San Diego, CA (US)

(73) Assignee: SEESCAN, INC., San Diego, CA (US)

( * ) Notice: Subject to any disclaimer, the term of this patent is extended or adjusted under 35 U.S.C. 154(b) by 0 days.

(21) Appl. No.: 18/207,391

(22) Filed: Jun. 8, 2023

Related U.S. Application Data

(63) Continuation of application No. 17/694,656, filed on Mar. 14, 2022, now Pat. No. 11,686,878, which is a
(Continued)

(51) Int. Cl.
*G01V 15/00* (2006.01)
*G01R 29/08* (2006.01)
(Continued)

(52) U.S. Cl.
CPC ........... *G01V 15/00* (2013.01); *G01R 29/085* (2013.01); *G01V 3/081* (2013.01); *G01V 3/104* (2013.01)

(58) Field of Classification Search
CPC . G01V 15/00; G01V 3/00; G01V 3/08; G01V 3/081; G01V 3/10; G01V 3/104;
(Continued)

(56) References Cited

U.S. PATENT DOCUMENTS

| | | | |
|---|---|---|---|
| 4,712,094 A | 12/1987 | Bolson, Sr. | |
| 4,761,656 A | 8/1988 | Cosman et al. | |

(Continued)

FOREIGN PATENT DOCUMENTS

| | | |
|---|---|---|
| EP | 0688438 | 12/1995 |
| WO | PCT/US03/069374 | 8/2003 |

(Continued)

OTHER PUBLICATIONS

International Searching Authority, "Written Opinion of the International Searching Authority" for PCT Patent Application No. PCT/US14/060981, Apr. 23, 2015, European Patent Office, Munich.
(Continued)

*Primary Examiner* — Hoai-An D. Nguyen
(74) *Attorney, Agent, or Firm* — Steven C. Tietsworth, Esq; Michael J. Pennington, Esq

(57) ABSTRACT

The present disclosure relates to electromagnetic marker devices for locating hidden or buried objects. One embodiment includes an antenna having a plurality of conductive windings enclosed in a housing made of a low dielectric constant material and an electronic circuit including a circuit board having circuit elements disposed thereon and electrically coupled to the conductive windings through a connector. The circuit elements receive an input signal having a first frequency from an above-ground transmitter, convert the input signal to a power supply to power up the electronic circuit, generate, in response to the input signal, an output signal having a second frequency different from the first frequency, and provide the output signal, via the antenna element, to an above-ground receiver.

6 Claims, 34 Drawing Sheets

Related U.S. Application Data continuation of application No. 16/449,187, filed on Jun. 21, 2019, now Pat. No. 11,280,934.

(60) Provisional application No. 62/864,441, filed on Jun. 20, 2019, provisional application No. 62/688,259, filed on Jun. 21, 2018.

(51) Int. Cl.
*G01V 3/08* (2006.01)
*G01V 3/10* (2006.01)

(58) Field of Classification Search
CPC .... G01R 29/00; G01R 29/08; G01R 29/0807; G01R 29/0814; G01R 29/085
USPC .............. 324/200, 260, 323, 326, 663, 693
See application file for complete search history.

(56) References Cited

U.S. PATENT DOCUMENTS

| | | |
|---|---|---|
| 4,791,412 A | 12/1988 | Brooks |
| 5,920,194 A | 7/1999 | Lewis et al. |
| 6,377,203 B1 | 4/2002 | Doany |
| 6,388,575 B1 | 5/2002 | Galloway |
| 6,617,856 B1 | 9/2003 | Royle et al. |
| 6,954,072 B1 | 10/2005 | Schlapp et al. |
| 8,013,610 B1 | 9/2011 | Merewether et al. |
| 8,264,226 B1* | 9/2012 | Olsson ............ G01V 3/10 324/67 |
| 8,727,217 B2 | 5/2014 | Balachandran et al. |
| 11,768,308 B2* | 9/2023 | Olsson ............ G01V 3/081 324/326 |
| 2013/0257434 A1 | 10/2013 | Edwards et al. |
| 2017/0299757 A1 | 10/2017 | Bench et al. |

FOREIGN PATENT DOCUMENTS

| | | |
|---|---|---|
| WO | PCT/US07/257800 | 11/2007 |
| WO | PCT/US13/033924 | 3/2013 |
| WO | PCT/US13/099790 | 4/2013 |
| WO | PCT/US13/148714 | 10/2013 |

OTHER PUBLICATIONS

International Searching Authority, "Written Opinion of the International Searching Authority" for PCT Patent Application No. PCT/US19/038585, Jan. 4, 2020, European Patent Office, Munich.

* cited by examiner

ELECTROMAGNETIC MARKER DEVICES FOR BURIED OR HIDDEN USE

FIELD

This disclosure relates generally to devices for marking objects or locations. More specifically, but not exclusively, the disclosure relates to electromagnetic marker devices for underground placement to aid in locating buried objects and provide extended signal reception and transmission range.

BACKGROUND

The evolving complexity of hidden or buried infrastructure requires precise knowledge of location and identification of utilities such as utility lines (e.g., underground power lines, gas lines, phone lines, fiber optic cable conduits, cable television (CATV) cables, sprinkler control wiring, water pipes, sewer pipes, etc.) for purposes of avoiding contact with other utilities as well as for enhancement, replacement, and/or repair. Such utility lines, collectively and individually herein referred to as "buried objects" or "buried utilities" may be buried under the ground and/or otherwise hidden from normal sight. Construction and/or excavation operations may require locations and/or identification of such utility lines be known so as to avoid costly and hazardous damage or destruction of infrastructure.

Traditionally, different types of markers have been used to indicate the presence of such buried objects. Most commonly known are above-ground aerosol paint or flag markers of different colors marked on a ground surface to denote specific buried objects and provide visual indication of location of such objects. Such paint or flag markers are usually color-coded according to the type of buried object they denote. Other kinds of markers include conventional underground RFID-type devices such as the electrical marker balls made by 3M that are placed near objects to be marked and are buried with the objects under the ground.

Conventional marker devices, such as marker balls, are passive devices that include a tuning circuit, which, upon receiving a signal transmitting electromagnetic energy at a specific frequency, resonate at or near the same frequency. For instance, the received signal must be at or near enough to the resonant frequency to energize the marker device. A receiver such as a buried object locator antenna may be used to detect resonant signals from the marker balls to determine their presence and location.

Traditional marker balls or other conventional marker devices, though advantageous over the above-ground paint and flag markers that are prone to chipping and fading, still suffer from various drawbacks. For example, these marker balls and other conventional marker devices often lack control over the received electromagnetic energy, which is often affected by their form factor, component construction, manufacturing tolerances, underground environment (e.g., wet or otherwise conductive soil) where the marker balls or other conventional marker devices are placed, etc. This can negatively affect performance of such marker balls or other conventional marker devices and result in a resonance signal having a gradually decayed amplitude often undetectable by a corresponding receiver or detectable, occasionally, with a limited signal range of 1 meter to 1.5 meters, thereby requiring close coupling with the receiver. Further, having a resonance signal at the same or nearly the same frequency of the received signal can cause backscattering at the receiver, thereby resulting in substantial interference which can make detection of the marker balls difficult and/or inaccurate.

The few marker balls and other conventional marker devices that do have some control over the received electromagnetic energy do so in order to modulate the signal (e.g., generally through phase or amplitude or frequency signal keying) in order to communicate data rather than to improve device performance. Consequently, such conventional marker devices that modulate signals suffer from the same performance drawbacks as other conventional marker devices.

Accordingly, there is a need in the art to address the above-described as well as other problems related to marker devices and associated systems for underground and similar applications.

SUMMARY

The disclosure relates to enhanced marker devices for placement below a ground surface in proximity to a buried object for the purpose of locating such object when required. The marker device may include an antenna element having a plurality of coil turns or windings electrically coupled to an electronic circuit and arranged to provide, in conjunction with the electronic circuit, an extended signal reception and transmission range of 2 or more meters facilitating improved detection of such marker devices by an above-ground receiver/transmitter.

In one aspect, the marker device may include a loop-shaped antenna element having a plurality of coil turns arranged in a loop form with outer ends of the windings electrically coupled to the electronic circuit.

In another aspect, the antenna element may include three individual coil turns connected in series with each coil turn electrically coupled to the electronic circuit.

In another aspect, the antenna element may include three individual coil turns amongst which the first two coil turns may be connected in series and the third coil turn may be connected in parallel with each coil turn electrically coupled to the electronic circuit.

In another aspect, the coil turns may be enclosed in a protective housing and may be arranged in a separated manner from each other with each coil turn being electrically coupled to the electronic circuit.

In another aspect, the protective housing may be made of a low dielectric material (e.g., material having a dielectric constant less than 3) and may additionally enclose air.

In another aspect, the electronic circuit may include a circuit board and a plurality of circuit elements disposed thereon.

In another aspect, a connector may be provided to electrically couple the plurality of individual coil turns to the circuit board. The connector may include connecting elements at each side of the circuit board for coupling to outer ends of the coil turns. The circuit board may include electrical traces to which the connecting elements may electrically couple the coil turns.

In another aspect, the electronic circuit may be enclosed in an insulating cover over-molded thereon to protect the circuit board and the circuit elements disposed thereon from underground environment such as soil and substance in the soil. The cover may also prevent ingress of liquid or other contaminants in the electronic circuit.

In another aspect, the circuit elements may be configured to receive, via the antenna element, an input signal at a first frequency from an above-ground transmitter (e.g., a buried object locator with an integrated transmitter). The input signal induces current flow in the windings sufficient to energize the circuit elements one or more of which may generate an output signal responsive to the input signal. The output signal may have a second frequency that is different from the first frequency (e.g., frequency of the input signal). Such an output signal may be transmitted to an above-ground receiver (e.g., the buried object locator) as a reply to the input signal to assist in determining location of the buried object.

In another aspect, a label may be disposed on or mechanically attached to the protective housing or the insulating cover. Such a label may include electronically-readable information pertaining to the marker device and may optionally include additional information pertaining to position or characteristics of the marker device or associated buried object.

In another aspect, the label may be laser marked directly on the protective housing, the insulating cover, and/or at other portions of the marker device.

In another aspect, one or more permanent magnets may be disposed in the marker device to generate magnetic field detectable by survey instruments or devices.

Various additional aspects, features, and functionality are further described below in conjunction with the appended Drawings.

BRIEF DESCRIPTION OF THE DRAWINGS

The present disclosure may be more fully appreciated in connection with the following detailed description taken in conjunction with the accompanying Drawings, wherein.

DETAILED DESCRIPTION OF EMBODIMENTS

Overview

Figure 1A:
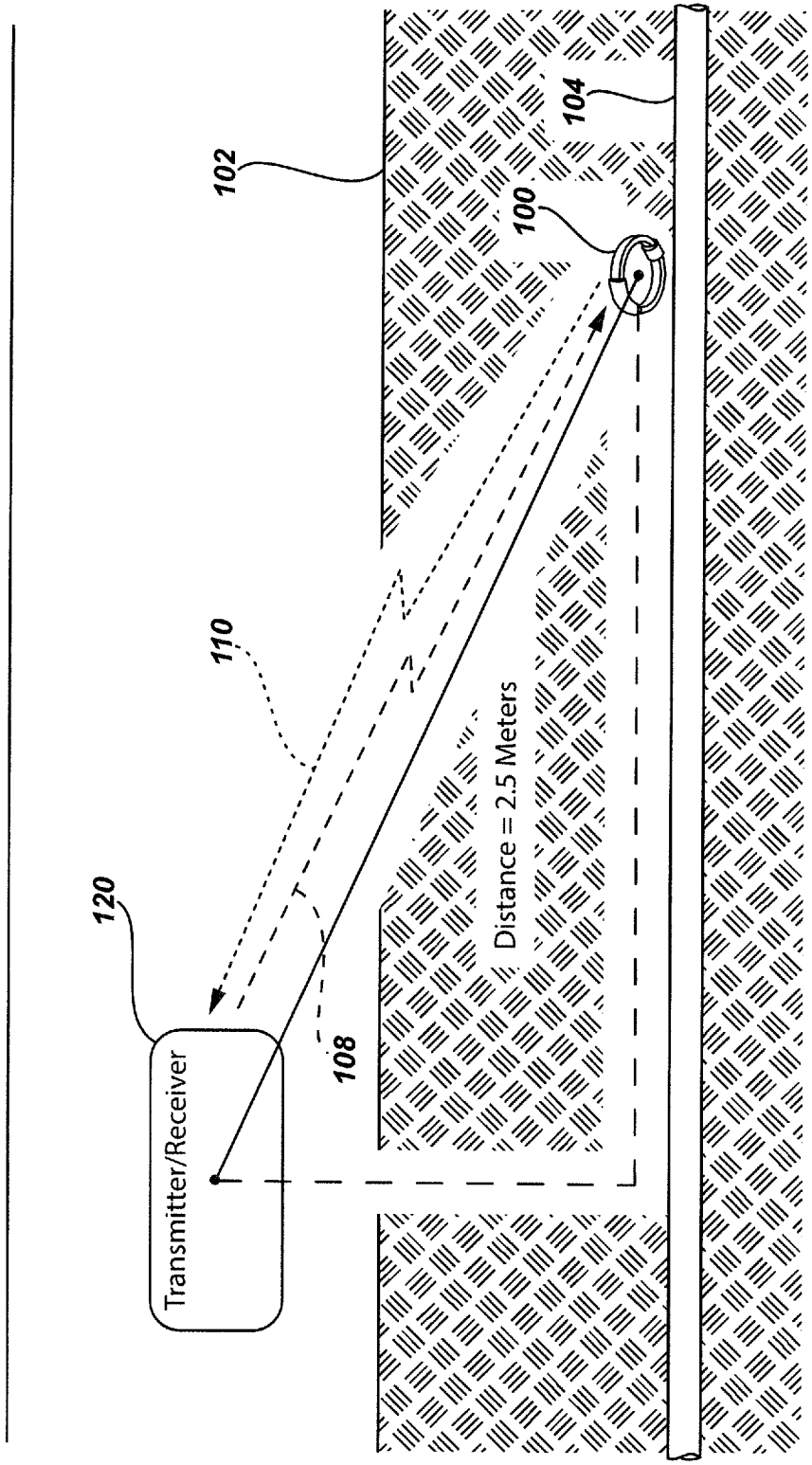
FIGS. 1A-1C illustrate embodiments of an enhanced marker device placed below a ground surface in proximity to a buried object.

This disclosure relates generally to enhanced marker devices that are placed underground for the purpose of locating buried objects and provide an extended signal reception and transmission range of two or more meters.

According to various aspects of the present disclosure, an enhanced marker device is disclosed that may be placed below a ground surface in proximity to a buried object for use in locating such object when required. The enhanced marker device may receive/send signals (e.g., radio frequency signals) from/to an above-ground transmitter/receiver, such as a buried object locator equipped with an excitation circuit (e.g., transmitter circuit) and an antenna element (e.g., receiver circuit), to assist in determining location of the buried object. For example, the marker device may include an antenna element coupled to an electronic circuit to receive an input signal (e.g., a radio frequency signal) having a first frequency from the above-ground transmitter and provide the received signal to the electronic circuit, which generates, in response to the input signal, an output signal (e.g., another radio frequency signal) having a second frequency that is substantially different from the first frequency. The generated output signal may be provided as a reply to the above-ground receiver to assist in determining location of the buried object associated with the marker device. The antenna element disclosed herein may include a plurality of coil turns electrically coupled, for example, in series or a combination of series and parallel arrangement, to the electronic circuit to provide, in conjunction with the electronic circuit, an extended signal reception and transmission range (e.g., 2 meters or more), thereby enabling signal communication between the transmitter/receiver and the marker device to be carried out effectively up to or even beyond 2 meters of distance range.

Additional details and examples of the above-ground transmitter/receivers such as buried object/utility locator that may be used in conjunction with the embodiments described subsequently herein are disclosed in co-assigned patent applications including: U.S. Pat. No. 7,009,399, issued Mar. 7, 2006, entitled OMNIDIRECTIONAL SONDE AND LINE LOCATOR; U.S. Pat. No. 7,136,765, issued Nov. 14, 2006, entitled A BURIED OBJECT LOCATING AND TRACING METHOD AND SYSTEM EMPLOYING PRINCIPAL COMPONENTS ANALYSIS FOR BLIND SIGNAL DETECTION; U.S. Pat. No. 7,221,136, issued May 22, 2007, entitled SONDES FOR LOCATING UNDERGROUND PIPES AND CONDUITS; U.S. Pat. No. 7,276,910, issued Oct. 2, 2007, entitled A COMPACT SELF-TUNED ELECTRICAL RESONATOR FOR BURIED OBJECT LOCATOR APPLICATIONS; U.S. Pat. No. 7,288,929, issued Oct. 30, 2007, entitled INDUCTIVE CLAMP FOR APPLYING SIGNAL TO BURIED UTILITIES; U.S. Pat. No. 7,298,126, issued Nov. 20, 2007, entitled SONDES FOR LOCATING UNDERGROUND PIPES AND CONDUITS; U.S. Pat. No. 7,332,901, issued Feb. 19, 2008, entitled LOCATOR WITH APPARENT DEPTH INDICATION; U.S. Pat. No. 7,336,078, issued Feb. 26, 2008, entitled MULTI-SENSOR MAPPING OMNIDIRECTIONAL SONDE AND LINE LOCATORS; U.S. Pat. No. 7,443,154, issued Oct. 28, 2008, entitled MULTI-SENSOR MAPPING OMNIDIRECTIONAL SONDE AND LINE LOCATOR; U.S. Pat. No. 7,498,797, issued Mar. 3, 2009, entitled LOCATOR WITH CURRENT-MEASURING CAPABILITY; U.S. Pat. No. 7,498,816, issued Mar. 3, 2009, entitled OMNIDIRECTIONAL SONDE AND LINE LOCATOR; United States U.S. Pat. No. 7,518,374, issued Apr. 14, 2009, entitled RECONFIGURABLE PORTABLE LOCATOR EMPLOYING MULTIPLE SENSOR ARRAYS HAVING FLEXIBLE NESTED ORTHOGONAL ANTENNAS; U.S. Pat. No. 7,557,559, issued Jul. 7, 2009, entitled COMPACT LINE ILLUMINATOR FOR LOCATING BURIED PIPES AND CABLES; U.S. Pat. No. 7,619,516, issued Nov. 17, 2009, entitled SINGLE AND MULTI-TRACE OMNIDIRECTIONAL SONDE AND LINE LOCATORS AND TRANSMITTER USED THEREWITH; U.S. patent application Ser. No. 12/704,808, filed Feb. 12, 2010, entitled PIPE INSPECTION SYSTEM WITH REPLACEABLE CABLE STORAGE DRUM; U.S. Pat. No. 7,733,077, issued Jun. 8, 2010, entitled MULTI-SENSOR MAPPING OMNIDIRECTIONAL SONDE AND LINE LOCATORS AND TRANSMITTER USED THEREWITH; U.S. Pat. No. 7,741,848, issued Jun. 22, 2010, entitled ADAPTIVE MULTICHANNEL LOCATOR SYSTEM FOR MULTIPLE PROXIMITY DETECTION; U.S. Pat. No. 7,755,360, issued Jul. 13, 2010, entitled PORTABLE LOCATOR SYSTEM WITH JAMMING REDUCTION; U.S. Pat. No. 7,825,647, issued Nov. 2, 2010, entitled METHOD FOR LOCATING BURIED PIPES AND CABLES; U.S. Pat. No. 7,830,149, issued Nov. 9, 2010, entitled AN UNDERGROUND UTILITY LOCATOR WITH A TRANSMITTER A PAIR OF UPWARDLY OPENING POCKETS AND HELICAL COIL TYPE ELECTRICAL CORDS; U.S. Pat. No. 7,863,885, issued Jan. 4, 2011, entitled SONDES FOR LOCATING UNDERGROUND PIPES AND CONDUITS; U.S. Pat. No. 7,948,236, issued May 24, 2011, entitled ADAPTIVE MULTICHANNEL LOCATOR SYSTEM FOR MULTIPLE PROXIMITY DETECTION; U.S. Pat. No. 7,969,419, issued Jun. 28, 2011, entitled PRE-AMPLIFIER AND MIXER CIRCUITRY FOR A LOCATOR ANTENNA; U.S. patent application Ser. No. 13/189,844, filed Jul. 25, 2011, entitled BURIED OBJECT LOCATOR SYSTEMS AND METHODS; U.S. Pat. No. 7,990,151, issued Aug. 2, 2011, entitled TRI-POD BURIED LOCATOR SYSTEM; U.S. Pat. No. 8,013,610, issued Sep. 6, 2011, entitled HIGH Q SELF-TUNING LOCATING TRANSMITTER; U.S. Pat. No. 8,035,390, issued Oct. 11, 2011, entitled OMNIDIRECTIONAL SONDE AND LINE LOCATOR; U.S. Pat. No. 8,106,660, issued Jan. 31, 2012, entitled SONDE ARRAY FOR USE WITH BURIED LINE LOCATOR; U.S. Pat. No. 8,203,343, issued Jun. 19, 2012, entitled RECONFIGURABLE PORTABLE LOCATOR EMPLOYING MULTIPLE SENSOR ARRAYS HAVING FLEXIBLE NESTED ORTHOGONAL ANTENNAS; U.S. patent application Ser. No. 13/584,799, filed Aug. 13, 2012, entitled BURIED OBJECT LOCATOR SYSTEMS AND METHODS; U.S. Pat. No. 8,248,056, issued Aug. 21, 2012, entitled A BURIED OBJECT LOCATOR SYSTEM EMPLOYING AUTOMATED VIRTUAL DEPTH EVENT DETECTION AND SIGNALING; U.S. Pat. No. 8,264,226, issued Sep. 11, 2012, entitled SYSTEMS AND METHODS FOR LOCATING BURIED PIPES AND CABLES WITH A MAN PORTABLE LOCATOR AND A TRANSMITTER IN A MESH NETWORK; U.S. patent application Ser. No. 13/647,310, filed Oct. 8, 2012, entitled PIPE INSPECTION SYSTEM APPARATUS AND METHODS; U.S. patent application Ser. No. 13/769,202, Feb. 15, 2013, entitled SMART PAINT STICK DEVICES AND METHODS; U.S. patent application Ser. No. 13/787,711, Mar. 6, 2013, entitled DUAL SENSED LOCATING SYSTEMS AND METHODS; U.S. patent application Ser. No. 13/793,168, filed Mar. 11, 2013, entitled BURIED OBJECT LOCATORS WITH CONDUCTIVE ANTENNA BOBBINS; U.S. Pat. No. 8,395,661, issued Mar. 12, 2013, entitled PIPE INSPECTION SYSTEM WITH SELECTIVE IMAGE CAPTURE; U.S. patent application Ser. No. 13/826,112, Mar. 14, 2013, entitled SYSTEMS AND METHODS INVOLVING A SMART CABLE STORAGE DRUM AND NETWORK NODE FOR TRANSMISSION OF DATA; U.S. patent application Ser. No. 13/851,951, Mar. 27, 2013, entitled DUAL ANTENNA SYSTEMS WITH VARIABLE POLARIZATION; U.S. patent application Ser. No. 13/894,038, May 14, 2013, entitled OMNI-INDUCER TRANSMITTING DEVICES AND METHODS; U.S. patent application Ser. No. 13/925,636, Jun. 24, 2013, entitled MODULAR BATTERY PACK APPARATUS, SYSTEMS, AND METHODS INCLUDING VIRAL DATA AND/OR CODE TRANSFER; U.S. Pat. No. 8,547,428, issued Oct. 1, 2013, entitled PIPE MAPPING SYSTEM; U.S. Pat. No. 8,564,295, issued Oct. 22, 2013, entitled METHOD FOR SIMULTANEOUSLY DETERMINING A PLURALITY OF DIFFERENT LOCATIONS OF THE BURIED OBJECTS AND SIMULTANEOUSLY INDICATING THE DIFFERENT LOCATIONS TO A USER; U.S. patent application Ser. No. 14/077,022, filed Nov. 11, 2013, entitled WEARABLE MAGNETIC FIELD UTILITY LOCATOR SYSTEM WITH SOUND FIELD GENERATION; U.S. patent application Ser. No. 14/148,649. Jan. 6, 2014, entitled MAPPING LOCATING SYSTEMS AND METHODS; U.S. Pat. No. 8,635,043, issued Jan. 21, 2014, entitled LOCATOR AND TRANSMITTER CALIBRATION SYSTEM; U.S. patent application Ser. No. 14/207,502, Mar. 12, 2014, entitled GRADIENT ANTENNA COILS FOR USE IN LOCATING SYSTEMS; U.S. patent application Ser. No. 14/214,151, Mar. 14, 2014, entitled DUAL ANTENNA SYSTEMS WITH VARIABLE POLARIZATION; U.S. Pat. No. 9,703,002, issued Jul. 13, 2014, entitled UTILITY LOCATOR SYSTEMS AND METHODS; U.S. patent application Ser. No. 14/446,145, Jul. 29, 2014, entitled UTILITY LOCATING SYSTEMS WITH MOBILE BASE STATION; U.S. Pat. No. 8,841,912, issued Sep. 23, 2014, entitled PRE-AMPLIFIER AND MIXER CIRCUITRY FOR A LOCATOR ANTENNA; U.S. patent application Ser. No. 14/709,301, filed May 11, 2015, entitled PIPE MAPPING SYSTEMS AND METHODS; U.S. Pat. No. 9,041,794, issued May 26, 2015, entitled PIPE MAPPING SYSTEMS AND METHODS; U.S. Pat. No. 9,057,754, issued Jun. 16, 2015, entitled ECONOMICAL MAGNETIC LOCATOR APPARATUS AND METHOD; U.S. patent application Ser. No. 14/797,760, Jul. 13, 2015, entitled HAPTIC DIRECTIONAL FEEDBACK HANDLES FOR LOCATING DEVICES; U.S. Pat. No. 9,081,109, issued Jul. 14, 2015, entitled GROUND-TRACKING DEVICES FOR USE WITH A MAPPING LOCATOR; U.S. patent application Ser. No. 14/800,490, Jul. 15, 2013, entitled UTILITY LOCATOR DEVICES, SYSTEMS, AND METHODS WITH SATELLITE AND MAGNETIC FIELD SONDE ANTENNA SYSTEMS; U.S. patent application Ser. No. 14/949,868, Nov. 23, 2015, entitled BURIED OBJECT LOCATORS WITH DODECAHEDRAL ANTENNA NODES; U.S. Pat. No. 9,207,350, issued Dec. 8, 2015, entitled BURIED OBJECT LOCATOR APPARATUS WITH SAFETY LIGHTING ARRAY; U.S. patent application Ser. No. 15/006,119, Jan. 26, 2016, entitled SELF-STANDING MULTI-LEG ATTACHMENT DEVICES FOR USE WITH UTILITY LOCATORS; U.S. patent application Ser. No. 15/434,056, Feb. 16, 2016, entitled BURIED UTILITY MARKER DEVICES, SYSTEMS, AND METHODS; U.S. Pat. No. 9,341,740, issued May 17, 2016, entitled OPTICAL GROUND TRACKING APPARATUS, SYSTEMS, AND METHODS; U.S. patent application Ser. No. 15/187,785, Jun. 21, 2016, entitled BURIED UTILITY LOCATOR GROUND TRACKING APPARATUS, SYSTEMS, AND METHODS; U.S. Pat. No. 9,372,117, issued Jun. 21, 2016, entitled OPTICAL GROUND TRACKING APPARATUS, SYSTEMS, AND METHODS; U.S. patent application Ser. No. 15/225,623, Aug. 1, 2016, entitled SONDE-BASED GROUND-TRACKING APPARATUS AND METHODS; U.S. patent application Ser. No. 15/247,503, Aug. 25, 2016, entitled LOCATING DEVICES, SYSTEMS, AND METHODS USING FREQUENCY SUITES FOR UTILITY DETECTION; U.S. Pat. No. 9,927,546, issued Aug. 29, 2016, entitled PHASE SYNCHRONIZED BURIED OBJECT LOCATOR APPARATUS, SYSTEMS, AND METHODS; U.S. Pat. No. 9,435,907, issued Sep. 6, 2016, entitled PHASE SYNCHRONIZED BURIED OBJECT LOCATOR APPARATUS, SYSTEMS, AND METHODS; U.S. Pat. No. 9,465,129, issued Oct. 11, 2016, entitled IMAGE-BASED MAPPING LOCATING SYSTEM; U.S. patent application Ser. No. 15/339,766, Oct. 31, 2016, entitled GRADIENT ANTENNA COILS AND ARRAYS FOR USE IN LOCATING SYSTEMS; U.S. patent application Ser. No. 15/345,421. Nov. 7, 2016, entitled OMNI-INDUCER TRANSMITTING DEVICES AND METHODS; U.S. Pat. No. 9,488,747, issued Nov. 8, 2016, entitled GRADIENT ANTENNA COILS AND ARRAYS FOR USE IN LOCATING SYSTEM; U.S. Pat. No. 9,494,706, issued Nov. 15, 2016, entitled OMNI-INDUCER TRANSMITTING DEVICES AND METHODS; U.S. patent application Ser. No. 15/360,979, Nov. 23, 2016, entitled UTILITY LOCATING SYSTEMS, DEVICES, AND METHODS USING RADIO BROADCAST SIGNALS; U.S. patent application Ser. No. 15/376,576, filed Dec. 12, 2016, entitled MAGNETIC SENSING BURIED OBJECT LOCATOR INCLUDING A CAMERA; U.S. Pat. No. 9,523,788, issued Dec. 20, 2016, entitled MAGNETIC SENSING BURIED OBJECT LOCATOR INCLUDING A CAMERA; U.S. patent application Ser. No. 15/396,068, filed Dec. 30, 2016, entitled UTILITY LOCATOR TRANSMITTER APPARATUS AND METHODS; U.S. patent application Ser. No. 15/457,149, Mar. 13, 2017, entitled USER INTERFACES FOR UTILITY LOCATORS; U.S. patent application Ser. No. 15/457,222, Mar. 13, 2017, entitled SYSTEMS AND METHODS FOR LOCATING BURIED OR HIDDEN OBJECTS USING SHEET CURRENT FLOW MODELS; U.S. patent application Ser. No. 15/457,897, Mar. 13, 2017, entitled UTILITY LOCATORS WITH RETRACTABLE SUPPORT STRUCTURES AND APPLICATIONS THEREOF; U.S. patent application Ser. No. 14/022,067, Mar. 21, 2017, entitled USER INTERFACES FOR UTILITY LOCATORS; U.S. Pat. No. 9,599,449, issued Mar. 21, 2017, entitled SYSTEMS AND METHODS FOR LOCATING BURIED OR HIDDEN OBJECTS USING SHEET CURRENT FLOW MODELS; U.S. patent application Ser. No. 15/470,642, Mar. 27, 2017, entitled UTILITY LOCATING APPARATUS AND SYSTEMS USING MULTIPLE ANTENNA COILS; U.S. patent application Ser. No. 15/470,713, Mar. 27, 2017, entitled UTILITY LOCATORS WITH PERSONAL COMMUNICATION DEVICE USER INTERFACES; U.S. patent application Ser. No. 15/485,082, Apr. 11, 2017, entitled MAGNETIC UTILITY LOCATOR DEVICES AND METHODS; U.S. Pat. No. 9,625,602, issued Apr. 18, 2017, entitled SMART PERSONAL COMMUNICATION DEVICES AS USER INTERFACES; U.S. patent application Ser. No. 15/497,040, Apr. 25, 2017, entitled SYSTEMS AND METHODS FOR LOCATING AND/OR MAPPING BURIED UTILITIES USING VEHICLE-MOUNTED LOCATING DEVICES; U.S. Pat. No. 9,632,202, issued Apr. 25, 2017, entitled ECONOMICAL MAGNETIC LOCATOR APPARATUS AND METHOD; U.S. Pat. No. 9,634,878, issued Apr. 25, 2017, entitled SYSTEMS AND METHODS FOR DATA SYNCHRONIZING QUADRATURE AMPLITUDE MODULATION (QAM); U.S. patent application Ser. No. 15/590,964, May 9, 2017, entitled BORING INSPECTION SYSTEMS AND METHODS; U.S. Pat. No. 9,651,711, issued May 16, 2017, entitled HORIZONTAL BORING INSPECTION DEVICE AND METHODS; U.S. patent application Ser. No. 15/626,399, Jun. 19, 2017, entitled SYSTEMS AND METHODS FOR UNIQUELY IDENTIFYING BURIED UTILITIES IN A MULTI-UTILITY ENVIRONMENT; U.S. Pat. No. 9,696,447, issued Jul. 4, 2017, entitled BURIED OBJECT METHODS AND APPARATUS USING MULTIPLE ELECTROMAGNETIC SIGNALS; U.S. Pat. No. 9,696,448, issued Jul. 4, 2017, entitled GROUND-TRACKING DEVICES FOR USE WITH A MAPPING LOCATOR; U.S. patent application Ser. No. 15/681,250, Aug. 18, 2017, entitled ELECTTRONIC MARKER DEVICES AND SYSTEMS; U.S. patent application Ser. No. 15/681,409, filed Aug. 20, 2017, entitled WIRELESS BURIED PIPE AND CABLE LOCATING SYSTEMS; U.S. Pat. No. 9,746,572, issued Aug. 29, 2017, entitled ELECTRONIC MARKER DEVICES AND SYSTEMS; U.S. Pat. No. 9,746,573, issued Aug. 29, 2017, entitled WIRELESS BURIED PIPE AND CABLE LOCATING SYSTEMS; U.S. patent application Ser. No. 15/728,250, Oct. 9, 2017, entitled OPTICAL GROUND TRACKING APPARATUS, SYSTEMS, AND METHODS FOR USE WITH BURIED UTILITY LOCATORS; U.S. Pat. No. 9,784,837, issued Oct. 10, 2017, entitled OPTICAL GROUND TRACKING APPARATUS, SYSTEMS, AND METHODS; U.S. patent application Ser. No. 15/811,361. Nov. 13, 2017, entitled OPTICAL GROUND TRACKING APPARATUS, SYSTEMS, AND METHODS; U.S. Pat. No. 9,841,503, issued Dec. 12, 2017, entitled OPTICAL GROUND TRACKING APPARATUS, SYSTEMS, AND METHODS; U.S. patent application Ser. No. 15/846,102, Dec. 18, 2017, entitled SYSTEMS AND METHODS FOR ELECTRONICALLY MARKING, LOCATING, AND VIRTUALLY DISPLAYING BURIED UTILITIES; U.S. patent application Ser. No. 15/866,360, Jan. 9, 2018, entitled TRACKED DISTANCE MEASURING DEVICE, SYSTEMS, AND METHODS; U.S. patent application Ser. No. 15/870,787, Jan. 12, 2018, entitled MAGNETIC FIELD CANCELING AUDIO SPEAKERS FOR USE WITH BURIED UTILITY LOCATORS OR OTHER DEVICES; U.S. patent application Ser. No. 15/925,643, Mar. 19, 2018, entitled PHASE-SYNCHRONIZED BURIED OBJECT TRANSMITTER AND LOCATOR METHODS AND APPARATUS; U.S. patent application Ser. No. 15/925,671. Mar. 19, 2018, entitled MULTI-FREQUENCY LOCATING SYSTEMS AND METHODS; U.S. Pat. No. 9,924,139, issued Mar. 20, 2018, entitled PORTABLE PIPE INSPECTION SYSTEMS AND APPARATUS; U.S. patent application Ser. No. 15/936,250, Mar. 26, 2018, entitled GROUND TRACKING APPARATUS, SYSTEMS, AND METHODS; U.S. Pat. No. 9,927,545, issued Mar. 27, 2018, entitled MULTI-FREQUENCY LOCATING SYSTEM AND METHODS; U.S. Pat. No. 9,928,613, issued Mar. 27, 2018, entitled GROUND TRACKING APPARATUS, SYSTEMS, AND METHODS; U.S. patent application Ser. No. 15/954,486, filed Apr. 16, 2018, entitled UTILITY LOCATOR APPARATUS, SYSTEMS, AND METHODS; U.S. Pat. No. 9,945,976, issued Apr. 17, 2018, entitled UTILITY LOCATOR APPARATUS, SYSTEMS, AND METHODSUS Provisional Patent Application 62/688,259, filed Jun. 21, 2018, entitled ACTIVE MARKER DEVICES FOR UNDERGROUND USE; U.S. Provisional Patent Application 62/726,500, filed Sep. 4, 2018, entitled VIDEO PIPE INSPECTION SYSTEMS, DEVICES, AND METHODS INTEGRATED WITH NON-VIDEO DATA RECORDING AND COMMUNICATION FUNCTIONALITY; U.S. patent application Ser. No. 16/178,494, filed Nov. 1, 2018, entitled THREE-AXIS MEASUREMENT MODULES AND SENSING METHODS; U.S. Provisional Patent Application 62/777,045, filed Dec. 7, 2018, entitled MAP GENERATION BASED ON UTILITY LINE POSITION AND ORIENTATION ESTIMATES; and U.S. Provisional Patent Application 62/824,937, filed Mar. 27, 2019, entitled LOW COST AND HIGH PERFORMANCE SIGNAL PROCESSING IN A BURIED OBJECT LOCATOR SYSTEM. Further implementations may include aspects and details of marker device embodiments as disclosed in U.S. Provisional Patent Application 62/864,441, filed Jun. 20, 2019, entitled ELECTROMAGNETIC MARKER DEVICES WITH SEPARATE RECEIVE AND TRANSMIT ANTENNA ELEMENTS. The content of each of the above-described patents and patent applications is incorporated by reference herein in its entirety. The above applications may be collectively denoted herein as the "co-assigned applications" or "incorporated applications."

As used herein, the term "buried objects" include utilities below the surface of the ground and utilities that are otherwise obscured, covered, or hidden from direct view or access, such as within walls, cavities, etc. In a typical application a buried object is a pipe, cable, conduit, wire, or other object made of a conductive material (e.g., metal, metal alloys, etc.) or a non-conductive material, (e.g., plastic, concrete, ceramic, etc.) buried under the ground surface, at a depth of from a few centimeters to meters or more, that a user, such as a utility company employee, construction company employee, homeowner, or other wants to locate, map (e.g., by the position), and/or mark its location. Example utilities include water or other fluid pipelines, sewer lines, electrical power lines, electrical or optical signaling lines, gas lines, and the like.

The following exemplary embodiments are provided for the purpose of illustrating examples of various aspects, details, and functions of the present disclosure; however, the described embodiments are not intended to be in any way limiting. It will be apparent to one of ordinary skill in the art that various aspects may be implemented in other embodiments within the spirit and scope of the present disclosure. As used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Various additional aspects, features, and functionality are further described below in conjunction with the appended Drawings.

EXAMPLE EMBODIMENTS

Figure 1B:
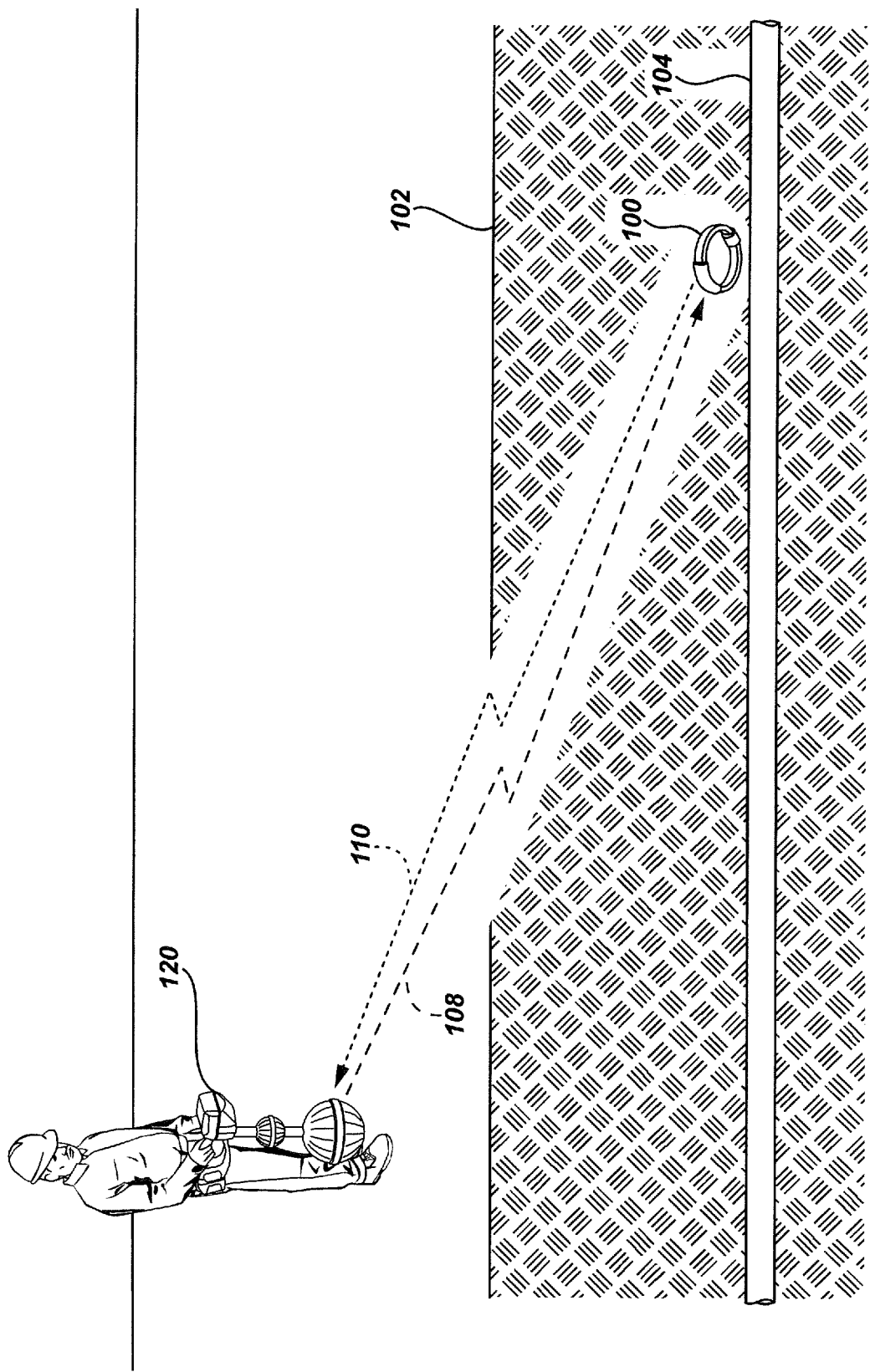
Figure 1C:
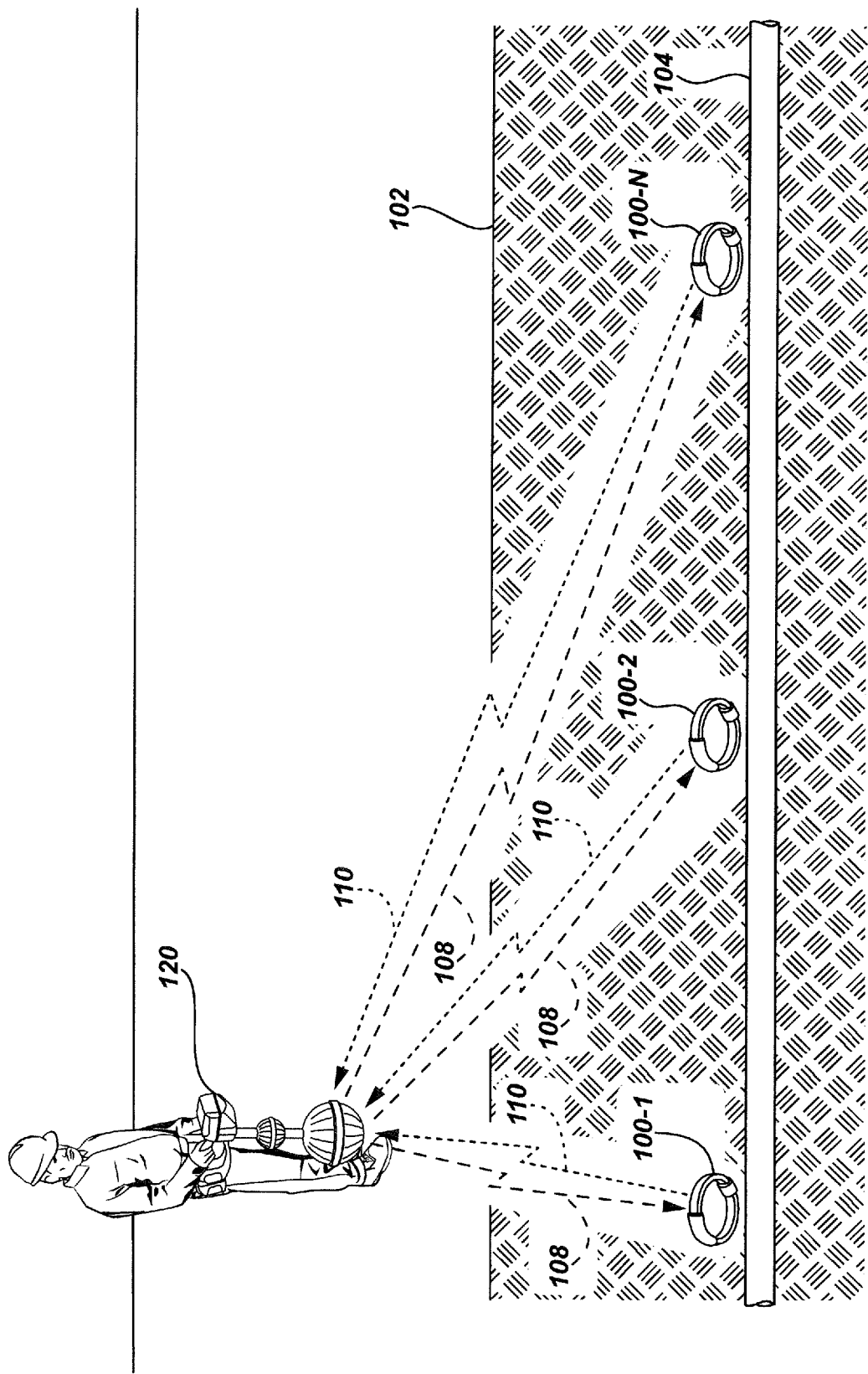

Details of example embodiments of an enhanced marker device placed under the ground are shown in FIGS. 1A-1C. As shown in the FIG. 1A, an enhanced marker device 100 (hereinafter referred to as a "marker device") may be placed under a ground surface 102 near a buried object 104 for locating the buried object 104 when required. The ground surface 102 may be of, for example, dirt or grass, a roadway, a sidewalk, a building floor, and the like under which the buried object(s) and the marker device(s) are placed.

The marker device 100 disclosed herein provides an extended signal reception and transmission range of 2 or more meters and may therefore receive/send radio frequency signals from/to an above-ground transmitter/receiver 120 located as far as 2 meters or beyond (e.g., 3 meters) of range.

In an example illustrated in the FIG. 1A, the marker device 100 may receive an input signal 108 from a transmitter/receiver 120 located at a distance of about 2.5 meters from the marker device 100. The input signal 108 may a continuous or pulsed radio frequency signal having a first frequency to energize the underground placed marker device 100. Energization may take place, for example, via extracting a portion or more of the electrometric energy from the input signal 108 and converting it into a power supply that may be used to power up one or more of the circuit elements within the marker device 100.

When powered, the marker device 100 may generate an output signal 110, which may also be a continuous or pulsed radio frequency signal but having a second frequency different from the frequency of the received input signal 108. The second frequency may be generated, for example, by dividing down the input signal frequency (i.e., first frequency). The input signal 108 may be divided down by a predefined value, such as 128 or other divisor values, to generate the output signal 110. For instance, if the input signal 108 is at a first frequency, say, 13,560,000 Hz, the output signal 110 may be generated to have a frequency of 105,937.5 Hz. Other frequencies and divide ratios may alternately be used in various embodiments based on particular operating environments, regulatory constraints, device constraints (e.g., power reduction, etc.), signal loss, and the like. The generated output signal 110 may be received by the transmitter/receiver 120 to assist in determining location of the buried object 104.

The transmitter/receiver 120 disclosed herein may, in some embodiments, be integrated in a single device, for example, in a buried object locator disclosed in an embodiment illustrated in FIG. 1B or the integrated buried object locator disclosed in the incorporated applications, in particular, U.S. Pat. No. 9,746,572, issued Aug. 29, 2017, entitled ELECTRONIC MARKER DEVICES AND SYSTEMS, the contents of which are incorporated by reference herein in their entirety.

Alternatively, the transmitter/receiver 120 may be in separate devices. The transmitter may be of conventional type capable of generating required output frequency, or it may be a standalone marker excitation device as disclosed in the incorporated applications including U.S. patent application Ser. No. 15/434,056, filed Feb. 16, 2016, entitled BURIED UTILITY MARKER DEVICES, SYSTEMS, AND METHODS, the contents of which are incorporated by reference herein in their entirety. Further, the receiver may be an antenna of conventional type capable of receiving with required sensitivity a signal of the transmitted frequency, or it may an antenna array arrangement included within a buried object locator disclosed in the incorporated application including U.S. patent application Ser. No. 15/434,056, filed Feb. 16, 2016, entitled BURIED UTILITY MARKER DEVICES, SYSTEMS, AND METHODS, the contents of which are incorporated by reference herein in their entirety.

According to a different embodiment, more than one marker devices may be placed near the buried object and may assist in locating the buried object such as a utility pipeline. Such marker devices may be buried, for example, at regular or predefined intervals or near certain specific regions (e.g., joints, turns, etc.) of the utility pipeline based on its layout and/or other factors.

FIG. 1C illustrates one such embodiment in which a plurality of marker devices placed under the ground surface is illustrated. As shown, a plurality of marker devices 100-1, 100-2, 100-N, collectively referred to as marker devices 100, may be placed under the ground surface 102 along an entire length of the buried object 104 at predefined or random intervals, to assist in locating and tracing the buried object 104. Each of these marker devices 100 may provide an extended signal reception and transmission range of, say, 2-5 meters that enables one or more of these marker devices 100 to be detectable by the transmitter/receiver 120. In one embodiment, a plurality of marker devices 100 within this range of up to 2-5 meters from the transmitter/receiver 120 may be energized substantially simultaneously.

In certain regions, objects may be buried more deeply than the other regions. For example, in certain cold climate regions, depending upon the frost line some objects such as gas pipelines may need to be buried more deeply (e.g., 5-6 feet below the ground surface) than other regions or other objects. In such cases, it may be desirable to place the marker device in proximity to such deeply buried objects.

Figure 1D:
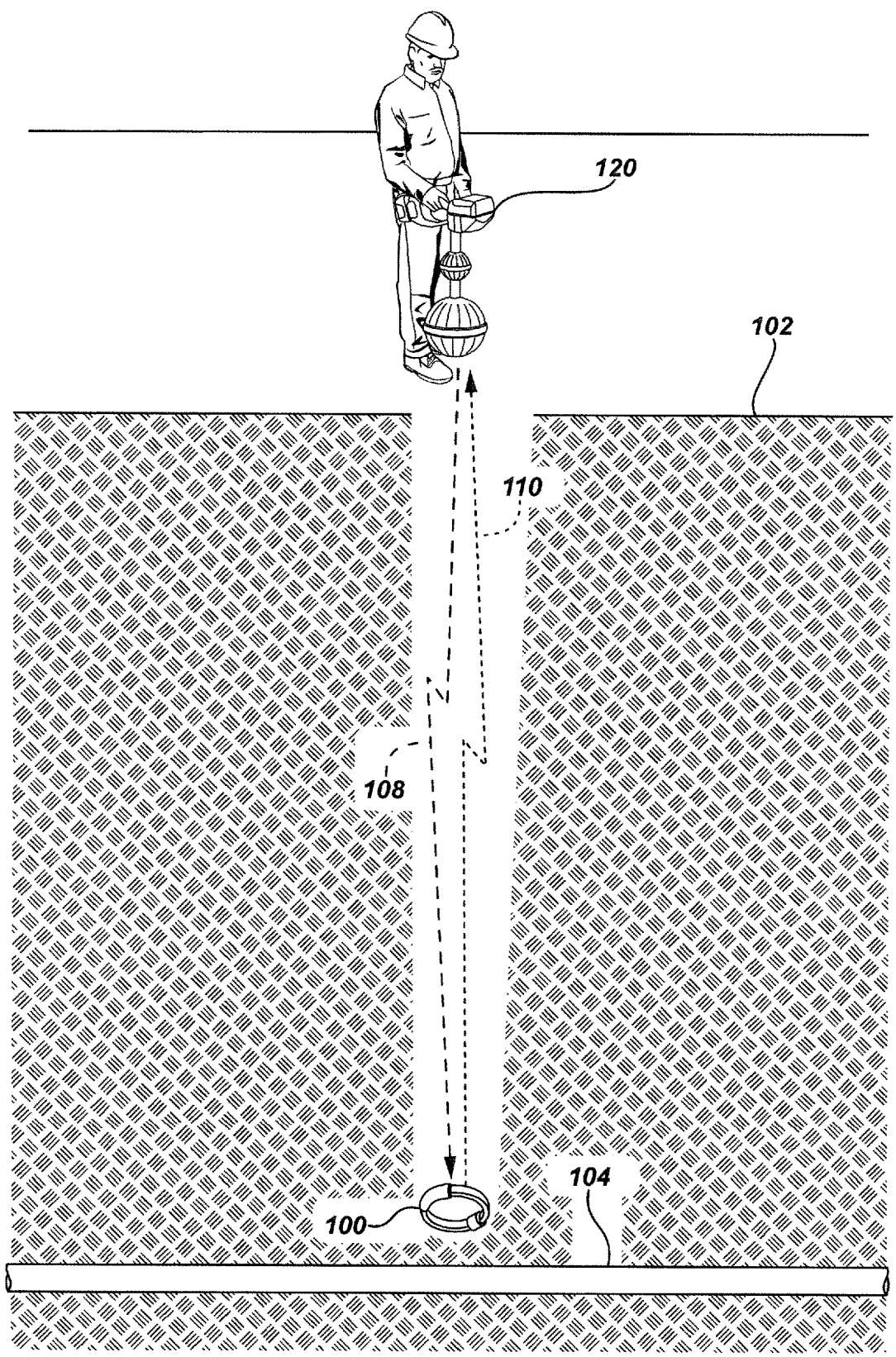
FIGS. 1D-1E illustrate embodiments of an enhanced marker device buried in proximity to a deeply buried object.
Figure 1E:
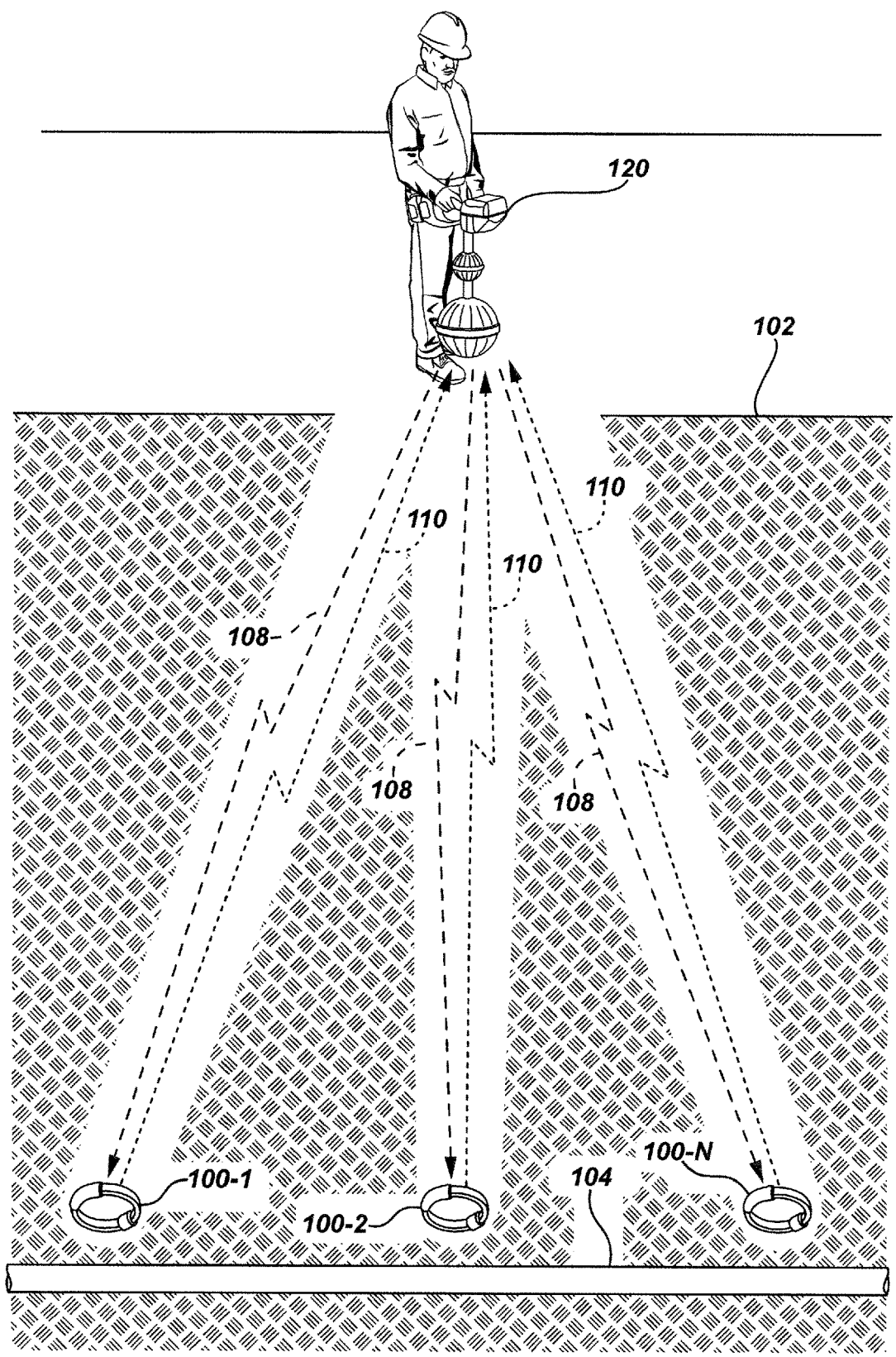

Illustrated in the FIGS. 1D and 1E are embodiments of enhanced marker device(s) buried in proximity to a deeply buried object. As shown, the marker device 100 (shown in FIG. 1D) or the plurality of marker devices 100-1, 100-2, 100-N, collectively referred to as marker devices 100 (shown in FIG. 1E) may be buried in proximity to a deeply buried object 104. As noted above, such marker device(s) 100 has an extended signal reception and transmission range (e.g., 2-5 meters), such an extended range may render the deeply buried marker device(s) 100 detectable by the above-ground transmitter/receiver 120, such as the buried object locator with an integrated transmitter.

Further details of the marker device and associated components are described with reference to the FIGS. 2A-2C.

Figure 2A:
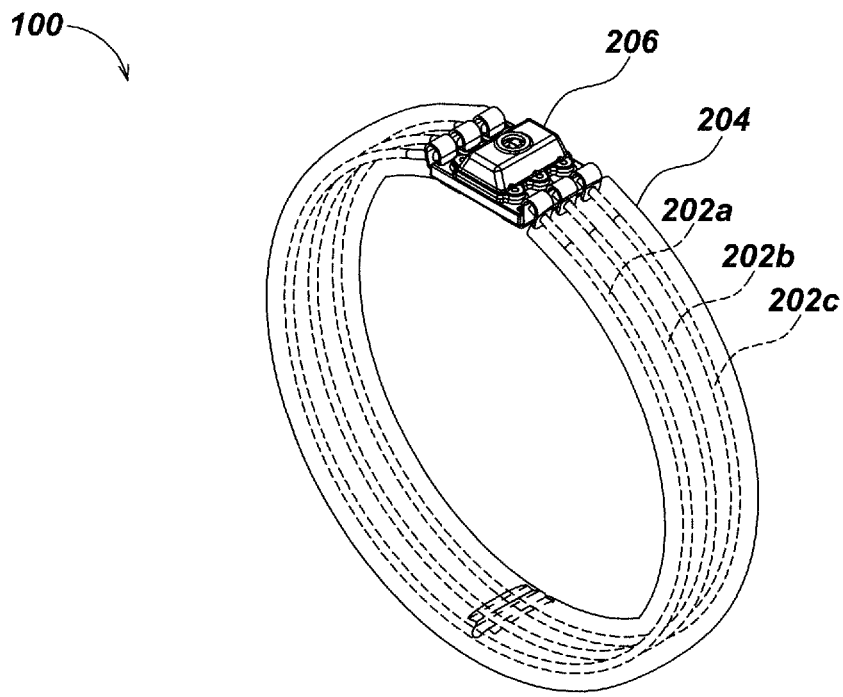
FIGS. 2A-2C illustrate embodiments of an enhanced marker device including a plurality of windings and associated elements.
Figure 2B:
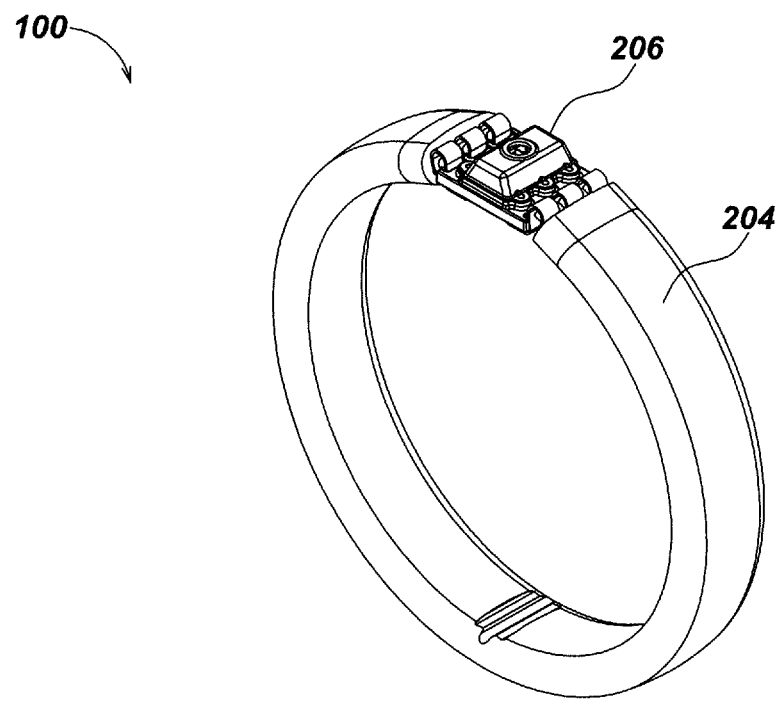
Figure 2C:
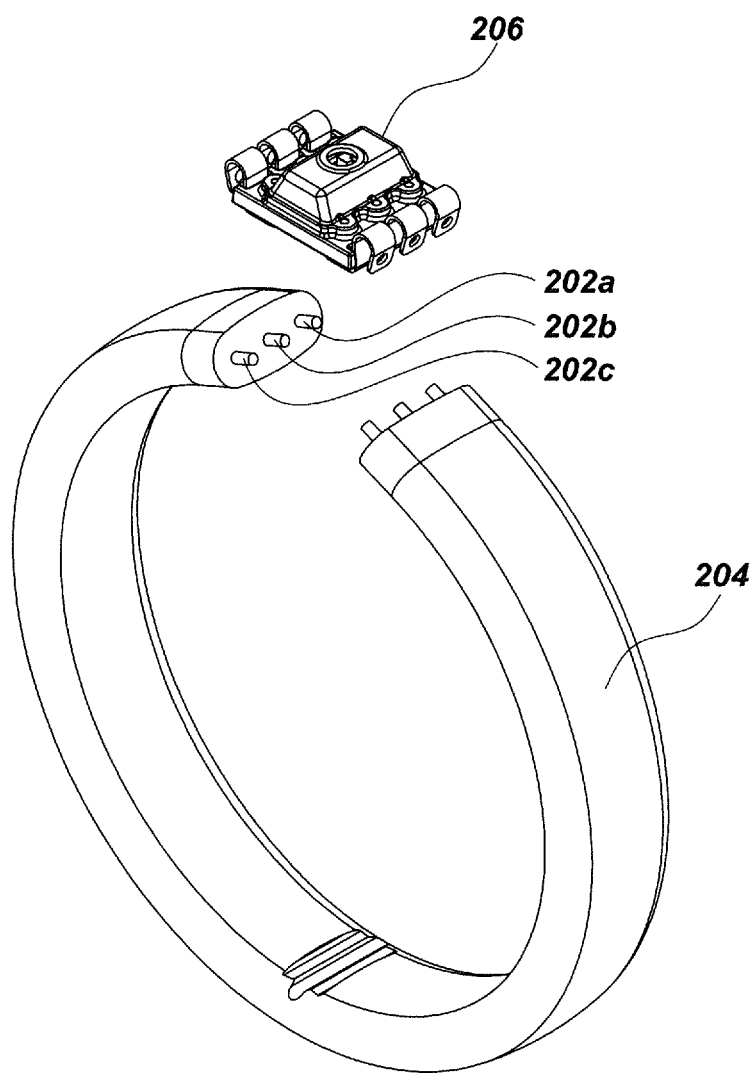

As shown in the FIG. 2A, the marker device 100 may include a plurality of coil turns (interchangeably referred to as 'antenna coil turns' or 'windings'), for example, three coil turns 202a, 202b, 202c (collectively referred to as coil turns 202) made of a conductive material such as copper, copper alloy, or other high conductive materials such as silver, gold, etc. In an embodiment, the coil turns 202 may be made of a copper-clad steel providing mechanical strength and may aid in maintaining the desired shape of coil turns 202 and overall marker device 100 while minimizing impedance at high operating frequencies due to the well-known skin effect of the current flow.

The coil turns 202 may be enclosed in protective housing 204 (shown in FIGS. 2B and 2C) made of a material having a low dielectric constant (e.g., polymers such as those having low dielectric constant, polypropylene (2.2-2.36), polyethylene (2.25), polystyrene (2.4-2.7), polytetrafluoroethylene (2.25), or other materials having a similarly low dielectric constant number) and it may additionally enclose air, to reduce capacitive coupling to the ground or underground environment in which the marker device 100 is buried. The housing 204 may protect the windings 202 from corrosive and otherwise damaging elements in the underground environment. Further, the housing 204 may have a predefined thickness (e.g., a thickness of approximately twice the diameter of the windings) to provide a physical distance between the coil turns 202 and the soil or the underground environment or a thickness determined based on various factors/parameters, including but not limited to, frequencies being utilized. The housing 204 and the physical distance created from the windings 202 may reduce capacitive coupling of both reception and transmission signals with the soil or other conductive elements in the soil, thereby reduce detuning of the marker device 100. The housing may further prevent ingress of ions, further reducing detuning of the marker device 100.

In an embodiment, the coil turns 202 may be individual coil turns arranged in a separated manner from each other in the housing 204, as shown in the FIG. 2A. Further, the coil turns 202 may be electrically coupled to an electronic circuit 206 (FIG. 2B) responsible for signal handling (e.g., processing of received input signals and generation of output signal).

Figure 3A:
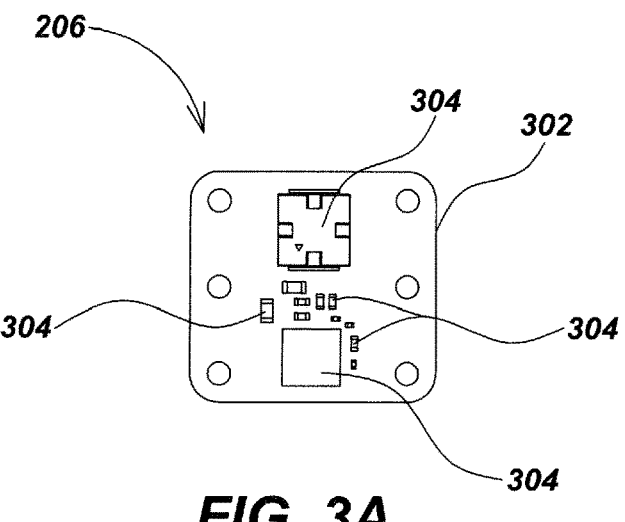
FIGS. 3A-3C illustrate embodiments of an electronic circuit.
Figure 3B:
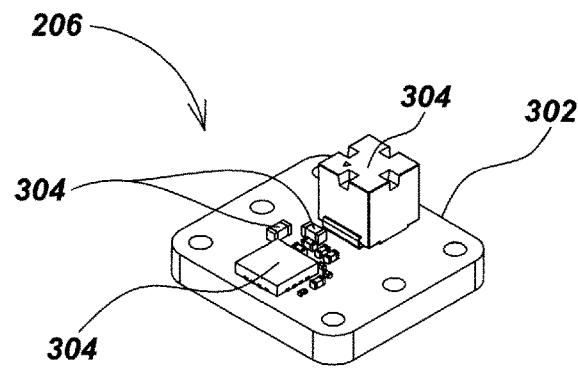
Figure 3C:
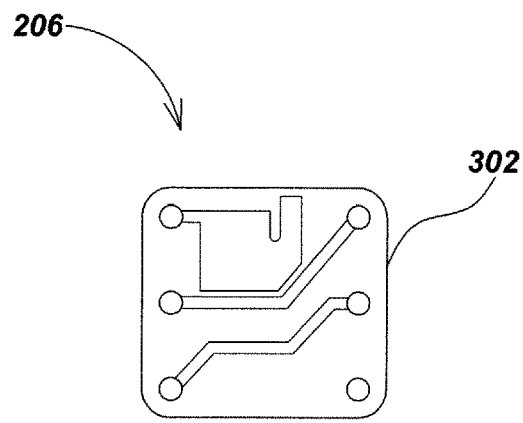

Exemplary embodiments of such an electronic circuit are illustrated by the FIGS. 3A-3C showing a front, isometric and rear view of an exemplary electronic circuit 206, respectively. As shown, the electronic circuit 206 may include a circuit board 302 (e.g., a printed circuit board) and a plurality of circuit elements 304 disposed thereon. The coil turns 202 may be electrically coupled to the circuit elements on the circuit board 302 via a connector.

Figure 4A:
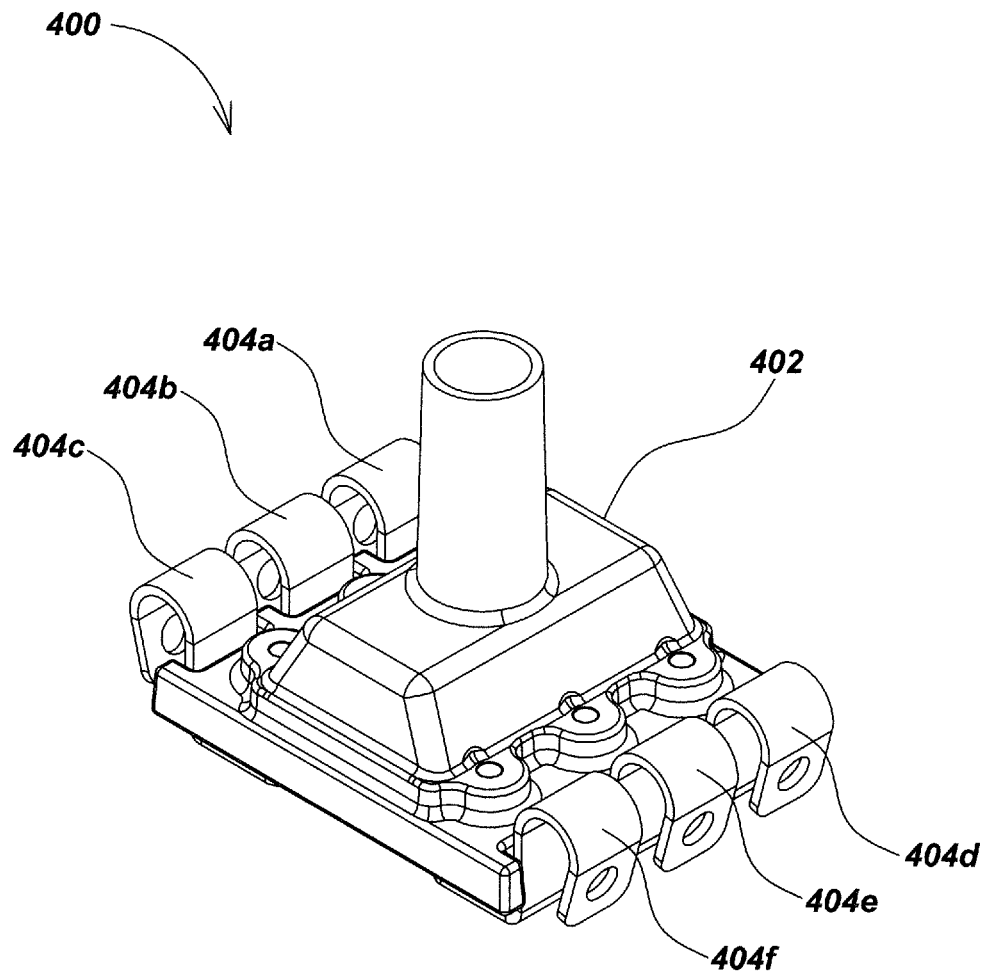
FIGS. 4A-4C illustrate embodiments of a connector for electrically coupling the windings to the electronic circuit.
Figure 4B:
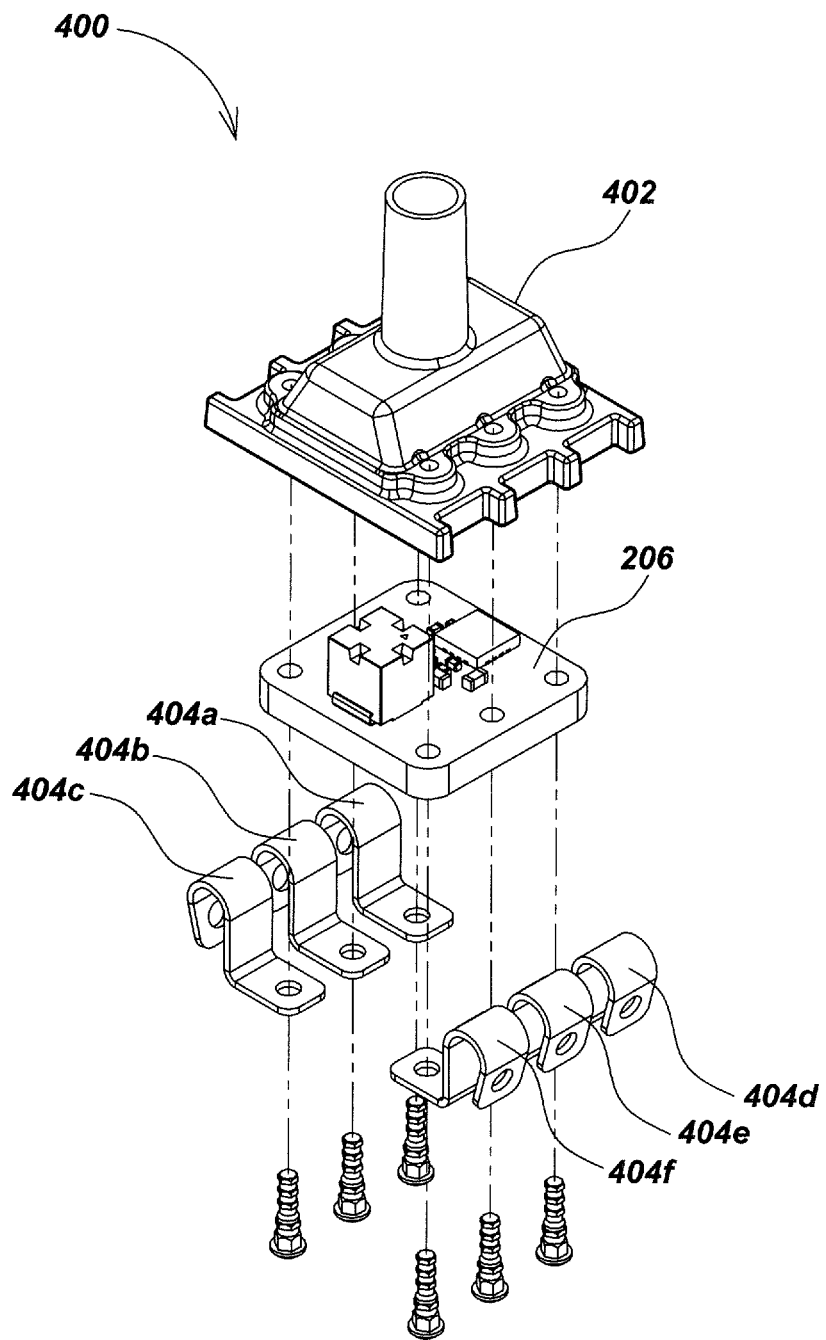
Figure 4C:
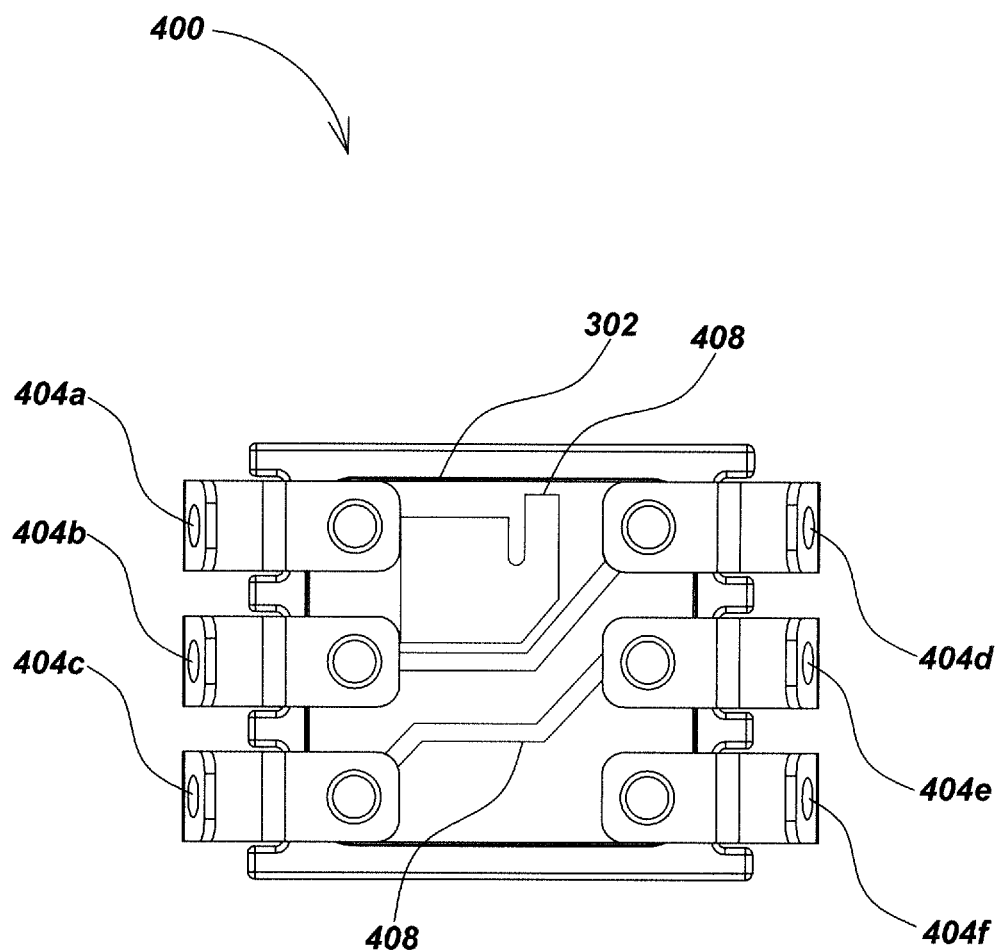

Referring to FIGS. 4A-4C, exemplary connector embodiments are illustrated. As shown, the connector 400 may include a connecting base 402 and a plurality of connecting elements, for example, the connecting elements 404a, 404b, and 404c for coupling first ends of the coil turns 202a, 202b and 202c to one side of the circuit board 302, and the connecting elements 404d, 404e and 404f for coupling the second ends of the coil turns 202d, 202e and 202f to the other side of the circuit board 302. The coil turns 202 may be sorted or fixed to the corresponding connecting elements 404, which are then mounted to the circuit board 302 via screws or other fixation elements, as shown in the FIGS. 4B and 4C. An electrical connection between the windings 202 and the circuit board 302/associated circuit elements 304 may be established via electrical circuit traces 408 (FIG. 4C) on the rear of the circuit board 302. Such an arrangement advantageously maintains the electrical connection between the coil turns 202 and the electronic circuit and possesses nearly no risk of losing connection due to breakage and/or loosening of the coil turns 202.

Figure 5:
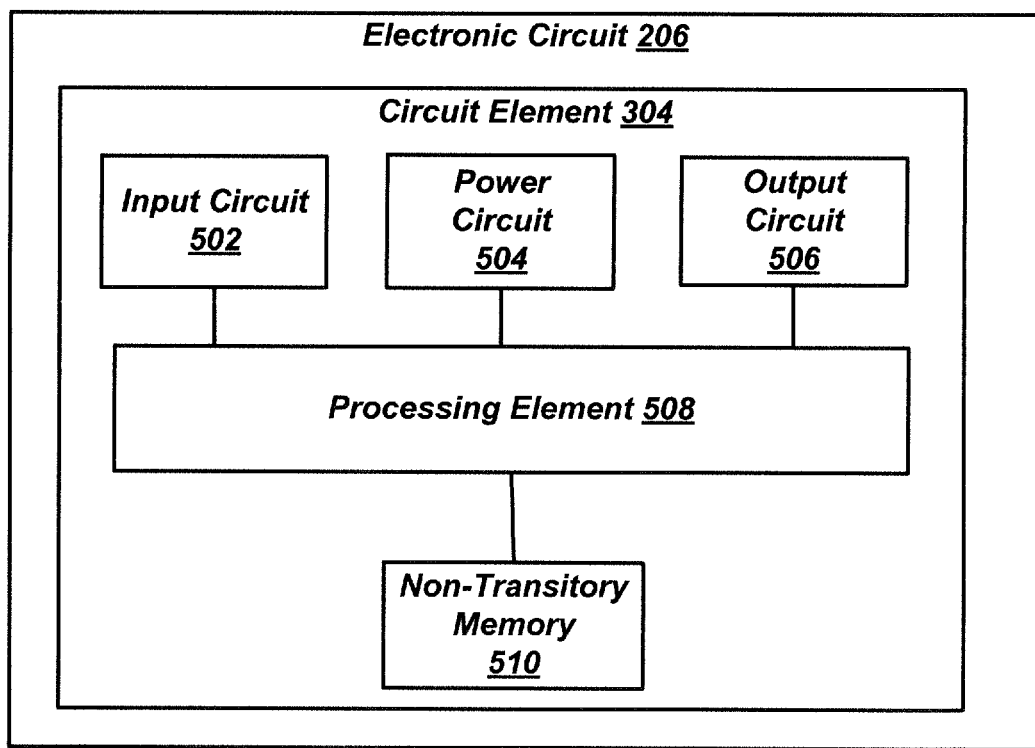
FIG. 5 illustrates a block diagram of the electronic circuit.

Turning to FIG. 5, a block diagram of the exemplary electronic circuit 206 is illustrated. As noted above, the electronic circuit 206 may include a circuit board 302 (e.g., a printed circuit board) and a plurality of circuit elements 304 disposed thereon (FIGS. 3A-3B). Such circuit elements 304 may include, for example, an input circuit 502, a power circuit 504, an output circuit 506, a processing circuit/element 508, a non-transitory memory 510, and/or other circuit elements to carry out programmed instructions. One or more of these circuits may include tuning elements (e.g., small value capacitors) controlled and/or adjusted automatically based on program instructions stored in the non-transitory memory 510, for auto-tuning of the marker device 100. The circuit elements 304 may further include a control circuit (not shown) programmed to selectively enable or disable other circuit elements depending upon their usage, function, and/or operating status, etc., to save power and optimize operation of the marker device 100.

Amongst the circuit elements, the input circuit 502 operates in conjunction with the antenna coil turns 202 to receive an input signal from the above-ground transmitter. From the input signal, the power circuit extracts the electromagnetic energy and converts it into a DC power to generate a power supply signal which may be used to power up other circuit elements. The processing element 508 may process the received input signal to generate an output signal which is responsive to the input signal and has a frequency different from the frequency of the input signal. The generated output signal may be provided to the antenna coil turns 202 via the output circuit 506 and transmitted by the coil turns 202, whereby the transmitted signal may be received by the above-ground receiver. The output signal may assist in determining the location of the buried object.

In an embodiment, information pertaining to the marker device and/or buried object may be embedded into the output signal. For example, the processing element 508 may obtain information pertaining to the marker device, such as serial number of the device, device ID, and/or other data stored in the non-transitory memory 510 and/or from a label containing electronically-readable information pertaining to the marker device, attached to or disposed on the marker device, and embed such information into the output signal. Alternatively, such information may be communicated to the above-ground transmitter/receiver via a separate signal.

Figure 6A:
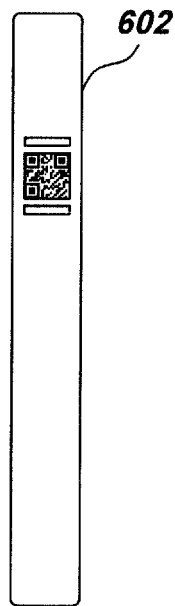
FIGS. 6A-6C illustrate embodiments of a label containing electronically-readable information, disposed on the enhanced marker device.
Figure 6B:
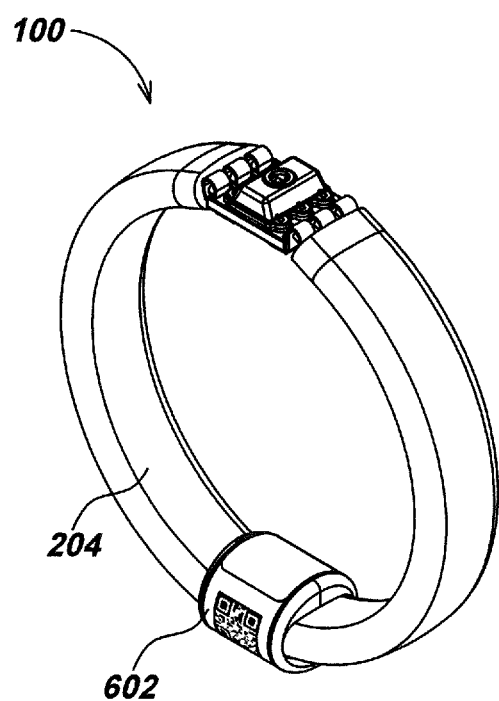
Figure 6C:
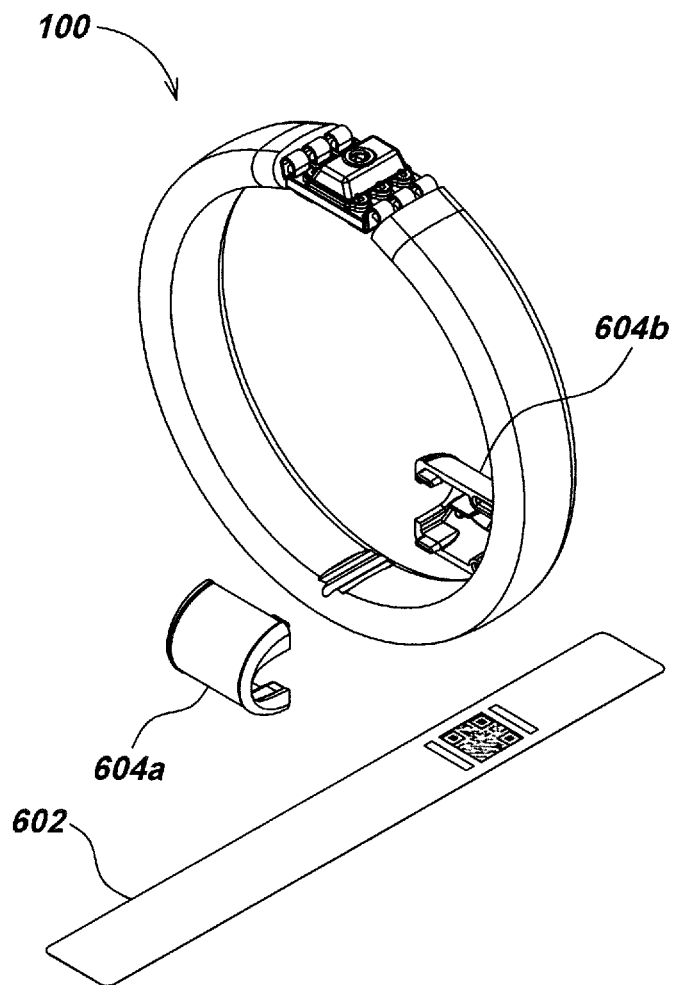

FIGS. 6A-6C illustrate embodiments of an exemplary label 602 attached to or disposed on the marker device 100. As shown, the label 602 may include electronically-readable information (e.g., device ID, serial number, dimensions, or other data) pertaining to the marker device 100. The electronically-readable information may be in the form a radio-frequency identification (RFID) tag, a quick response (QR) code, a barcode, a microchip, or the like. Additionally, the label 602 may include human-readable information (not shown) printed thereon. Such human-readable information may include a portion of or all of the electronically-readable information and/or additional information useful for users. For instance, the label 602 may include dimensions of the marker device 100 (e.g., 100 mm), device number (e.g., 'XYZ 0002') associated with the marker device 100, serial code (e.g., '00001000'), and/or other information pertaining to the marker device 100. The serial code may be, but is not restricted to, an 8 bit code. In an example, the label 602 may be wrapped around a connector, such as a snap lock connector having connector elements 604a and 604b locked together when mated, as shown in the FIG. 6C. According to another embodiment (not illustrated), the label may be laser marked on the protective housing, the insulating cover, and/or at other portions of the marker device. For example, the label may be laser marked on the surface of the housing made of a low dielectric constant polymer material. A laser marking additive (e.g., OnCap™ additive from PolyOne Corporation (www.polyone.com) or other laser marking additives known in the art, or their combinations) may be added to or dispersed in the polymer material of the housing to laser mark the label directly on the surface of the housing.

Returning to FIG. 5, the electronic circuit 206 may additionally include a control circuit (not shown) to selectively enable or disable other circuit elements depending upon usage, function, and/or operating status, etc. of such elements, to save power. Further, the electronic circuit 206 may include timing circuits (not shown) which may be used in conjunction with the control circuit for timer based control of the power circuits or other circuit elements. One or more of the circuit elements 304 described above and/or additional circuit elements may be provided to communicate information (e.g., serial number or other marker device information) from the underground placed marker device 100 through signal modulation (e.g., amplitude signal keying (ASK), phase signal keying (PSK), frequency signal keying (FSK), or the like).

In order to protect the electronic circuit 206 from the underground environment, an insulating cover may be provided to enclose the circuit board and the circuit elements. The cover may be over-molded on the electronic circuit. Alternatively, the cover may be disposed around the electronic circuit in another sealing manner to protect the circuit board and circuit elements from the underground contaminants.

Figure 7A:
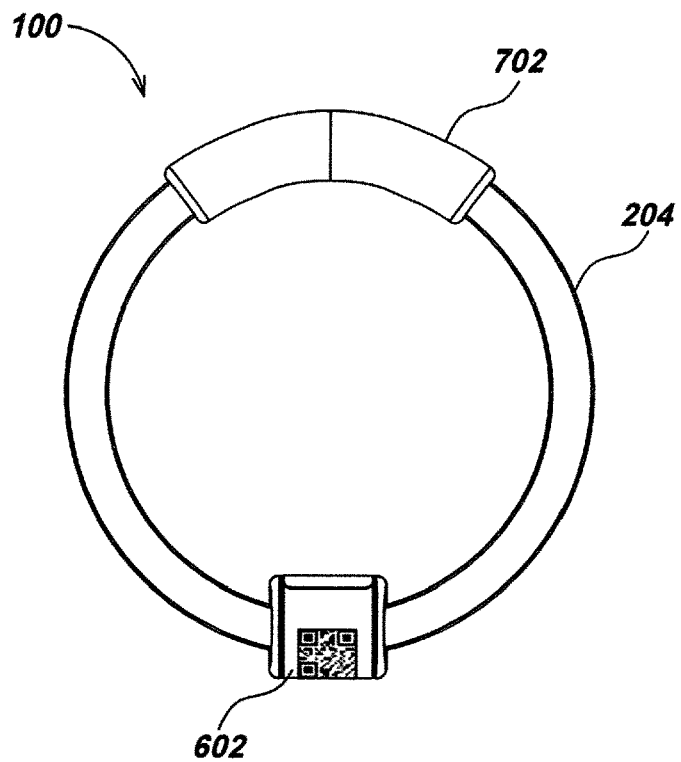
FIGS. 7A-7B illustrate embodiments of a protective cover enclosing the electronic circuit.
Figure 7B:
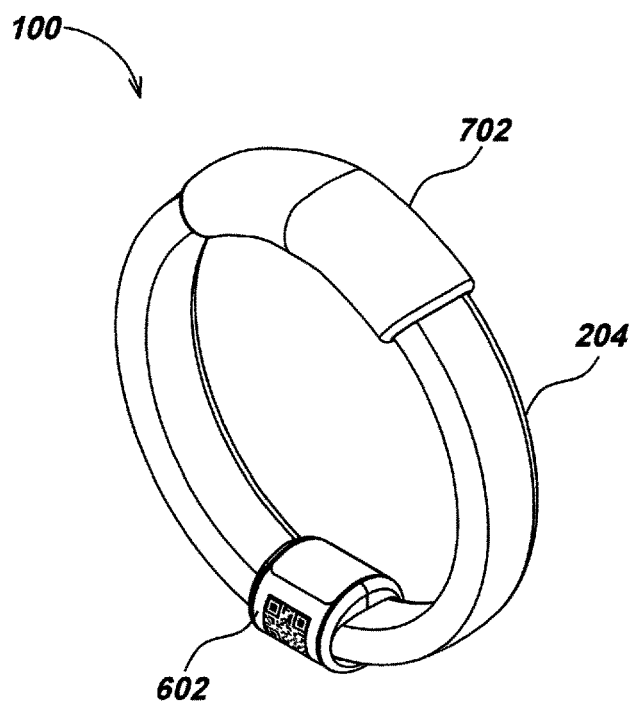

According to the embodiment illustrated in the FIGS. 7A and 7B, the cover 702 may be over-molded on the electronic circuit and portions of the protective housing 204, to prevent ingress of moisture, liquid or other contaminants. The cover 702 may be made of a material having a low dielectric constant (e.g., polymers having dielectric constant less than 3, polypropylene (2.2-2.36), polyethylene (2.25), polystyrene (2.4-2.7), polytetrafluoroethylene (2.25), or other materials having a similarly low dielectric constant number) and it may optionally include air. The cover 702 may have a predefined thickness, for example, a thickness of approximately twice the diameter of the coil(s) or a thickness determined based on various factors/parameters, including but not limited to, frequencies being utilized, to reduce or prevent detuning of the marker device 100.

Figure 8:
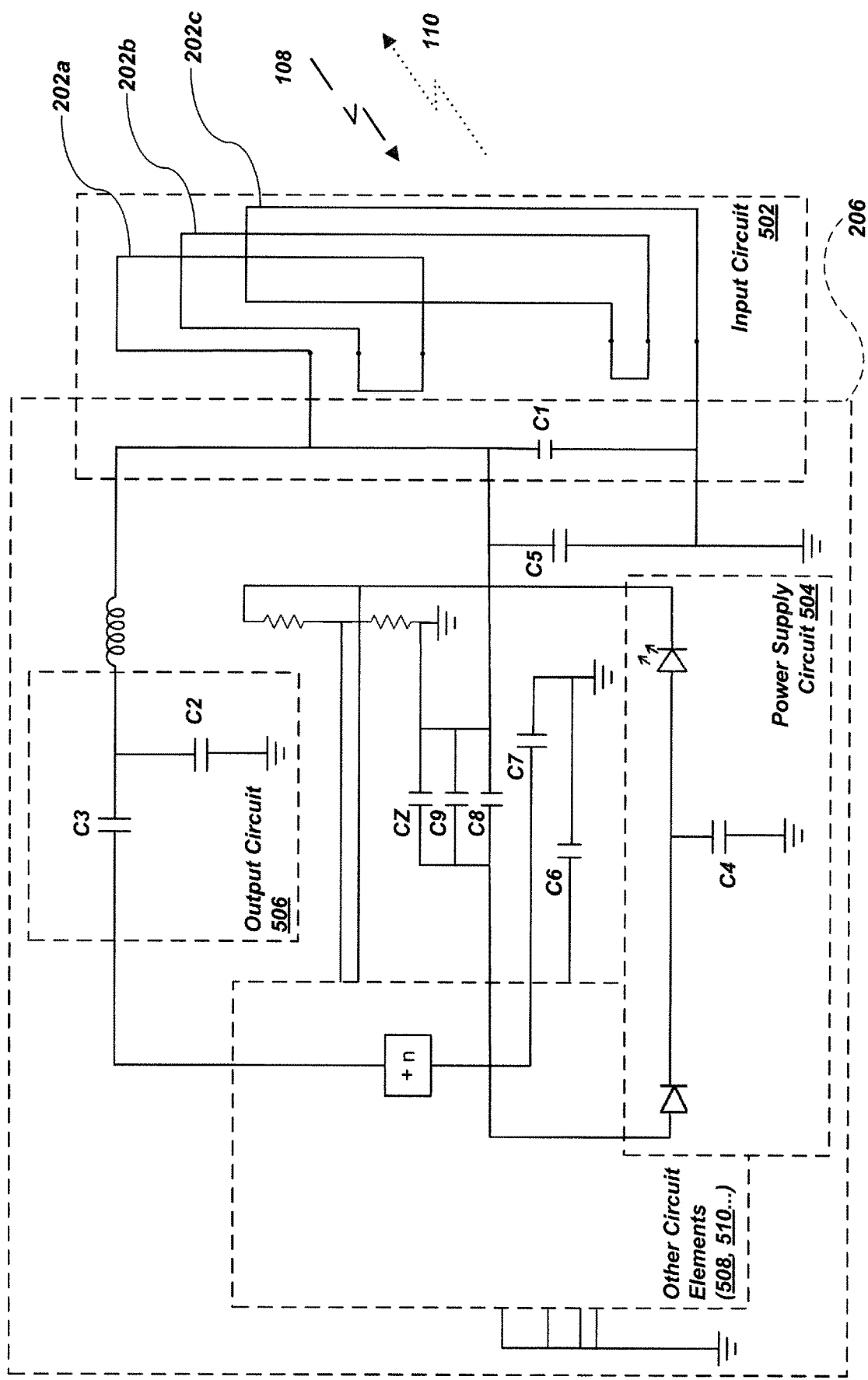
FIG. 8 illustrates a circuit diagram embodiment of the electronic circuit with windings connected in series.
Figure 9:
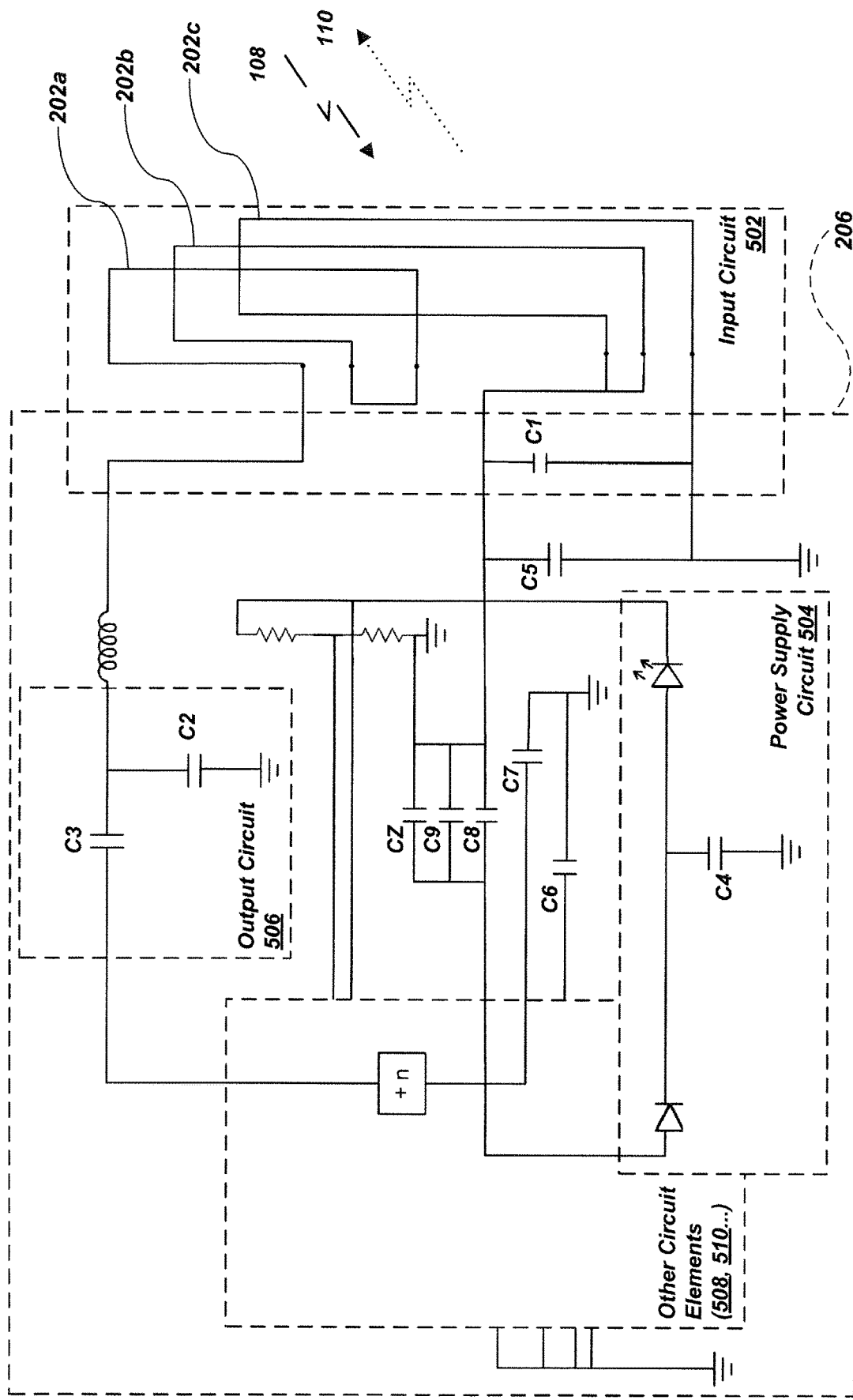
FIG. 9 illustrates a circuit diagram embodiment of the electronic circuit with windings coupled in series and parallel combination.

Turning to the FIG. 8, a circuit diagram of the electronic circuit 206 and its connection with antenna windings 202 is illustrated. As shown, the antenna includes three coil turns 202a, 202b and 202c all of which may be connected in series to the electronic circuit 206. In another embodiment shown in the FIG. 9, two of the coil turns (e.g., 202a and 202b) may be connected in series and the third one (202c) in parallel to the electronic circuit 206.

Figure 10A:
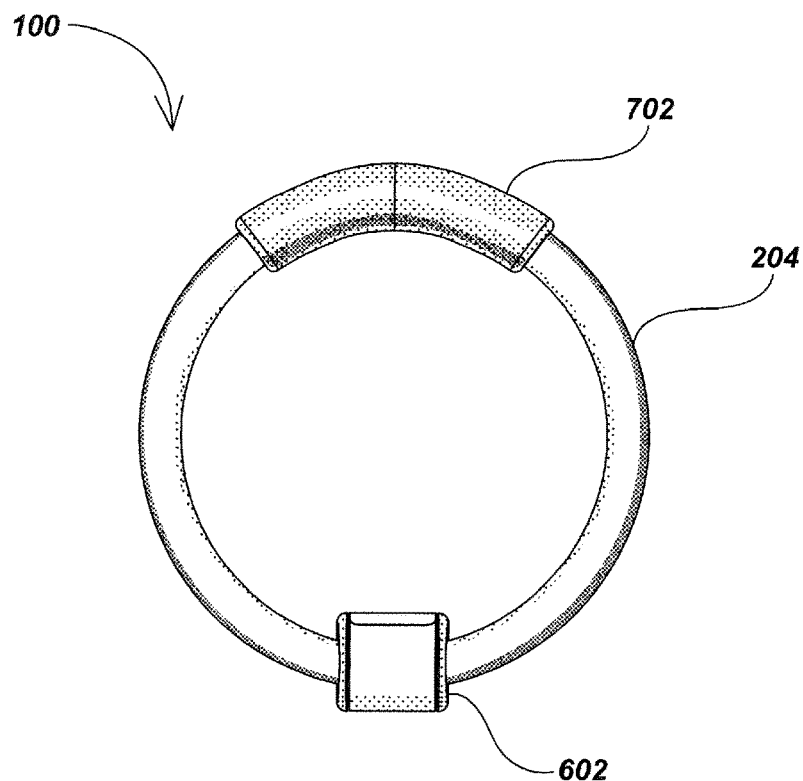
FIGS. 10A-10M illustrate exemplary shapes of the enhanced marker device according to different embodiments of the present disclosure.
Figure 10B:
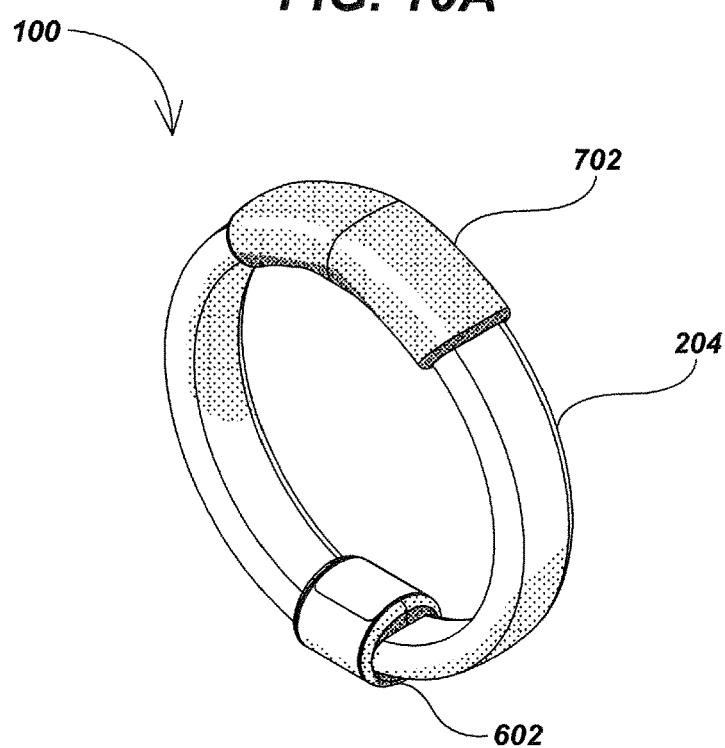
Figure 10C:
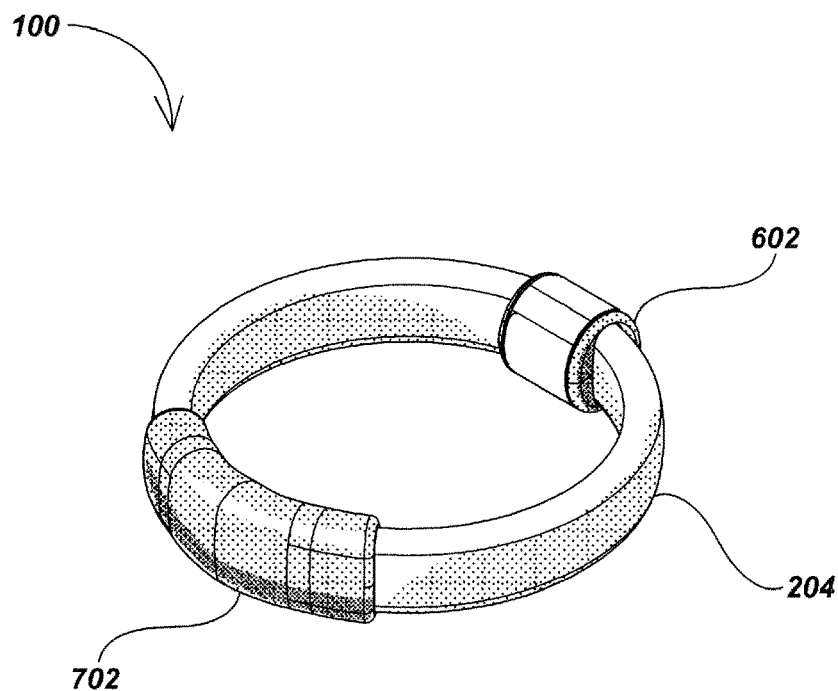
Figure 10D:
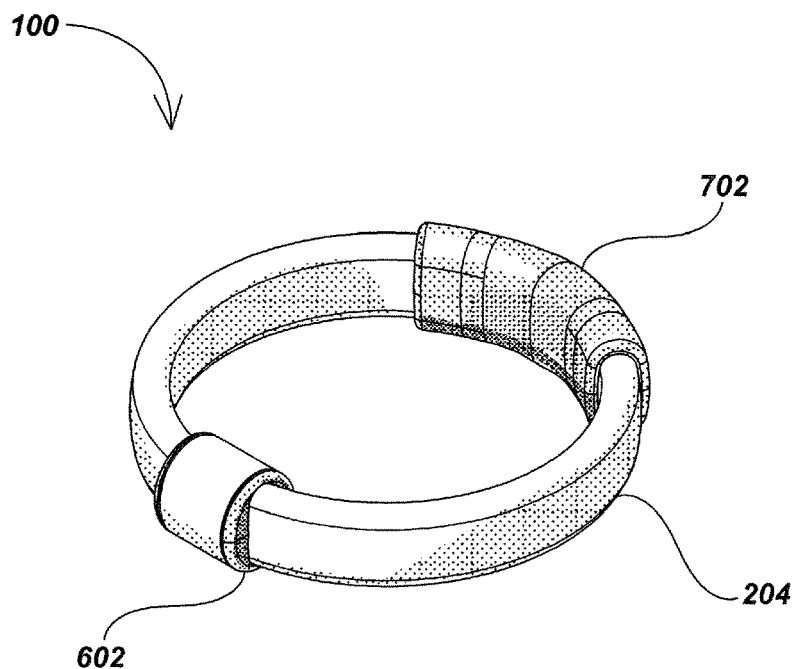
Figure 10F:
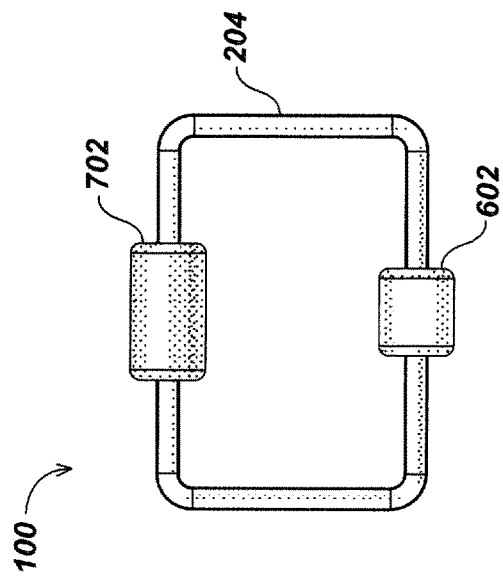
Figure 10G:
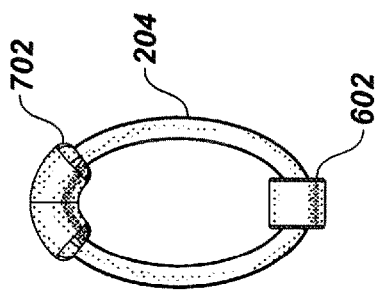
Figure 10E:
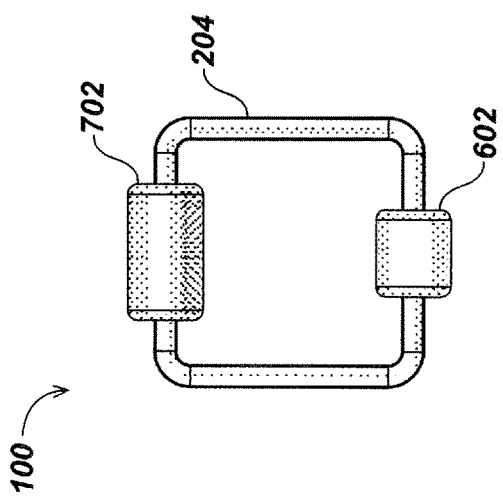
Figure 10H:
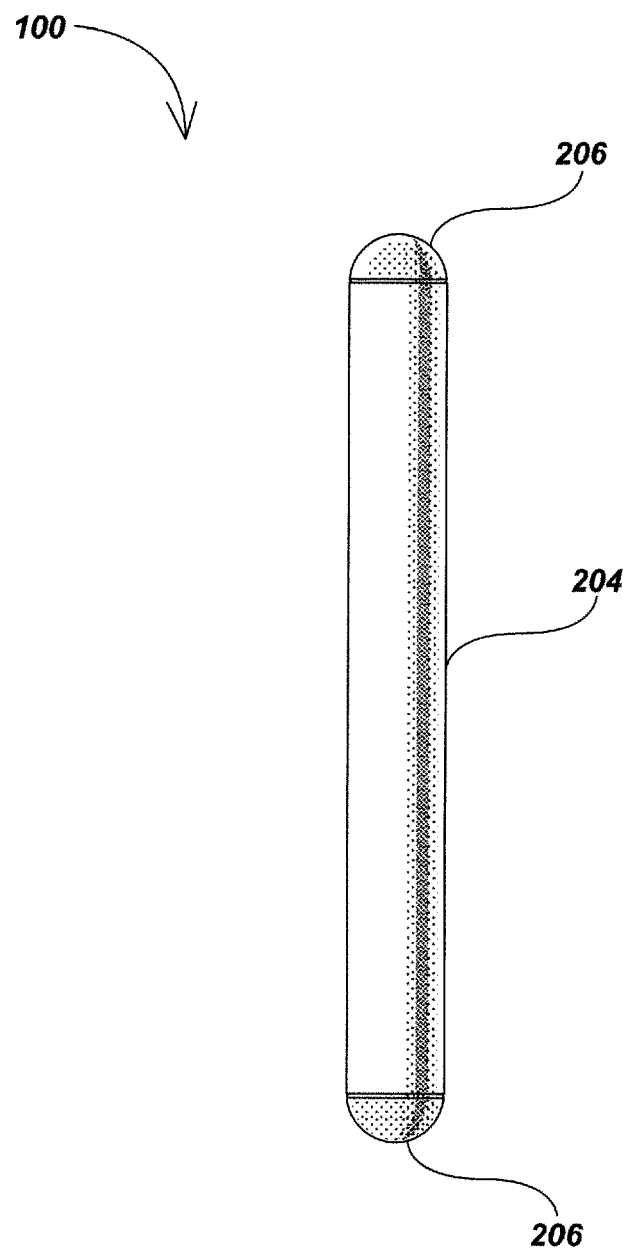
Figure 10I:
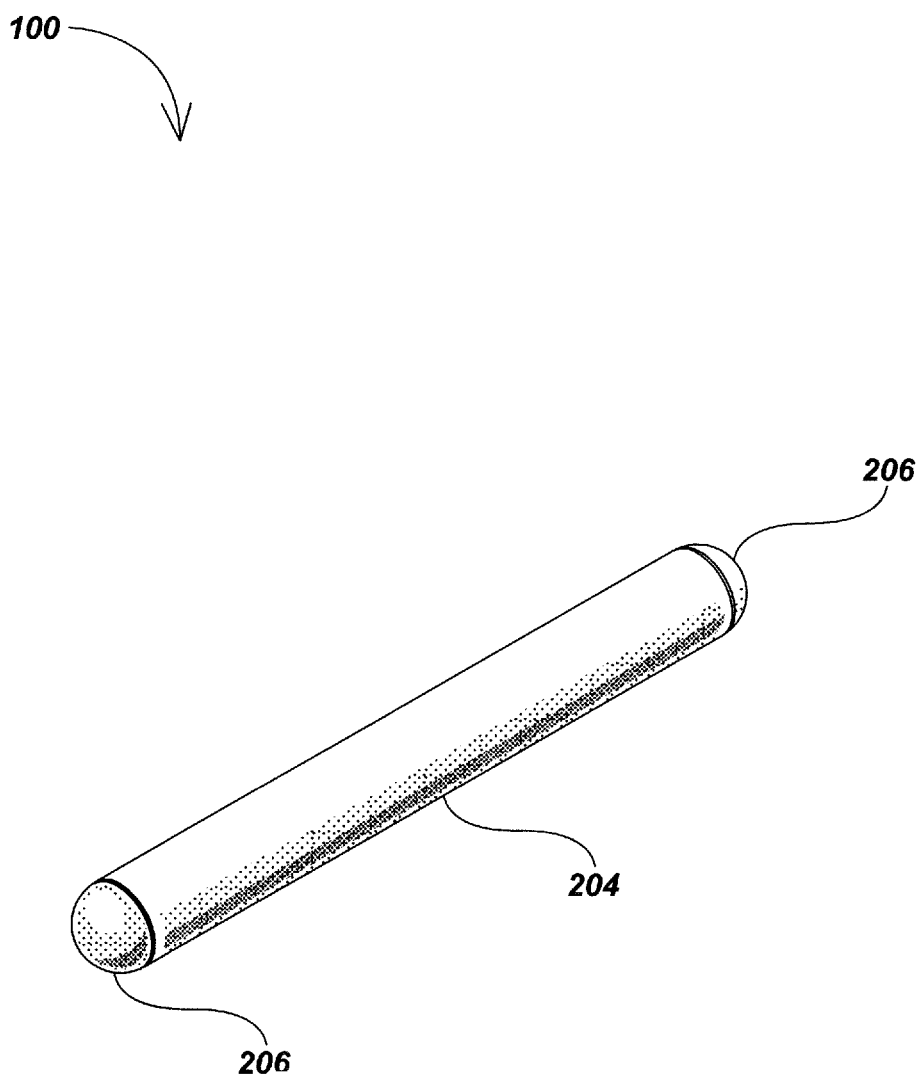
Figure 10J:
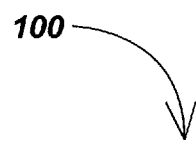
Figure 10J:
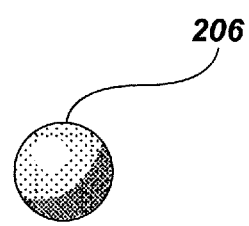
Figure 10K:
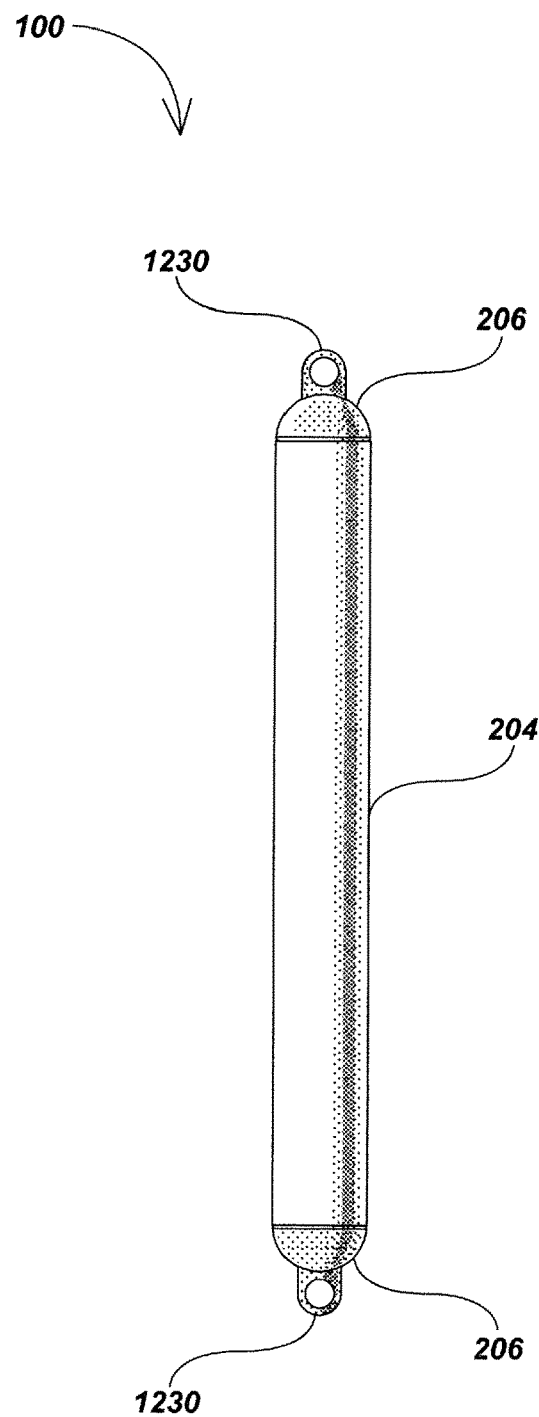
Figure 10L:
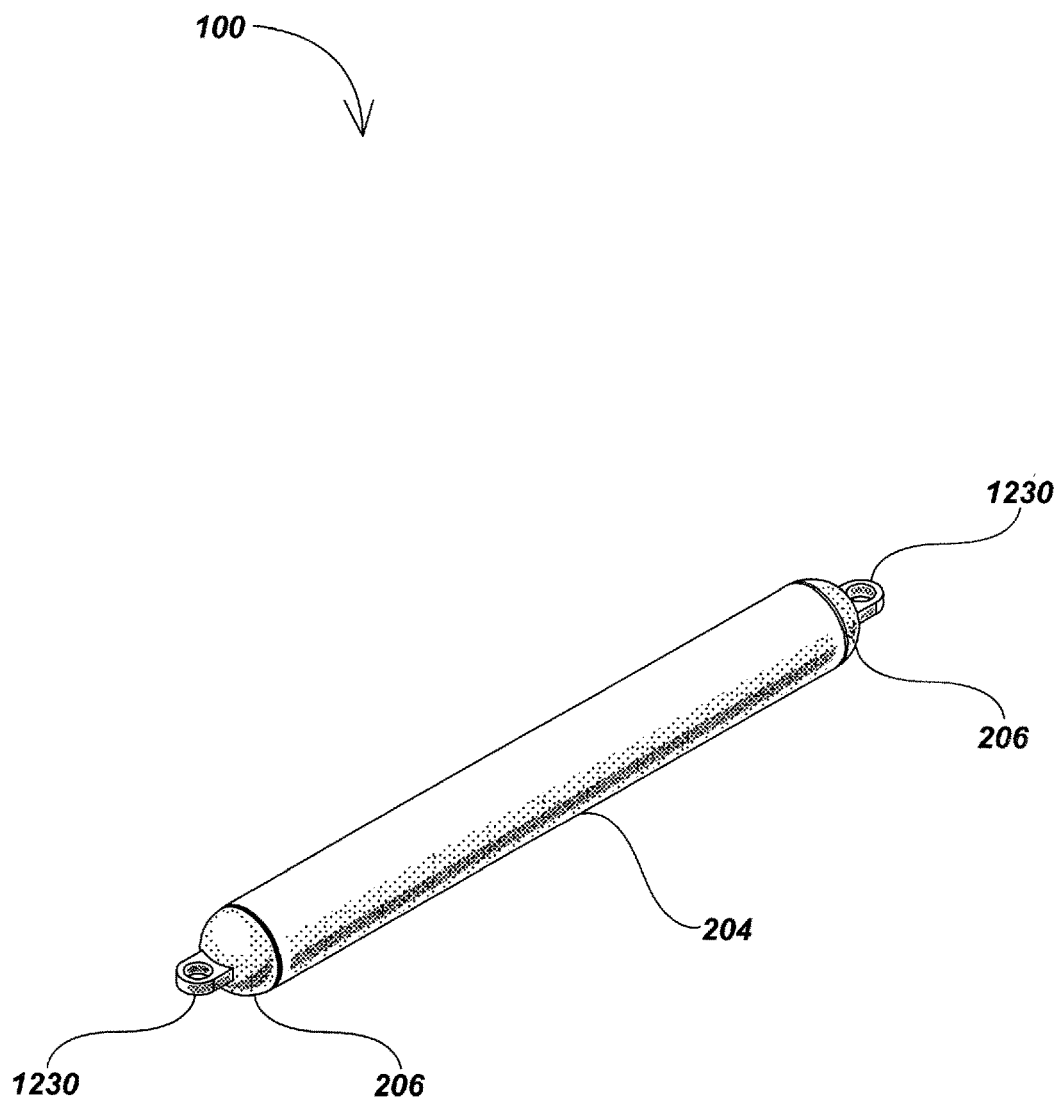
Figure 10M:
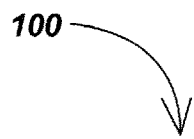
Figure 10M:
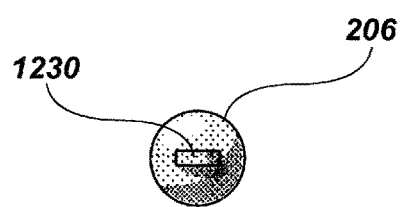

The embodiments of the marker device 100 disclosed herein and shown in the appended drawings relate mostly to a loop-shaped or ring-shaped marker device 100 having antenna coil turns 202 arranged to form a loop with its outer free ends electrically coupled to each side of the circuit board 302. Different views of such a loop or ring shaped marker device 100 is further illustrated in the FIGS. 10A-10D. This shape and arrangement, however, is not intended to be construed in a limiting sense. The marker device 100, according to other embodiments of the present disclosure, may be designed in several other shapes, including but not limited or restricted to, a square shape as shown in the FIG. 10E, a rectangular shape as shown in the FIG. 10F, an oblong shape as shown in the FIG. 10G, a pin or capsule like shape/configuration as shown in the FIGS. 10H-10M, and several other shapes (not shown for the sake of brevity) incorporating one or more of the features, elements and/or functionalities described in the foregoing and forthcoming embodiments without deviating from the scope of the present disclosure.

Figure 11A:
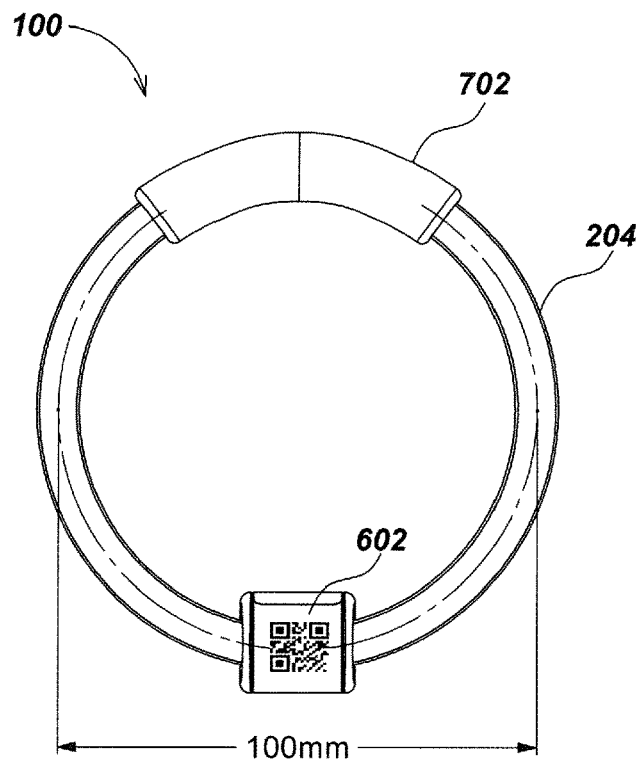
FIGS. 11A-11B illustrate exemplary dimensioned marker device embodiments.
Figure 11B:
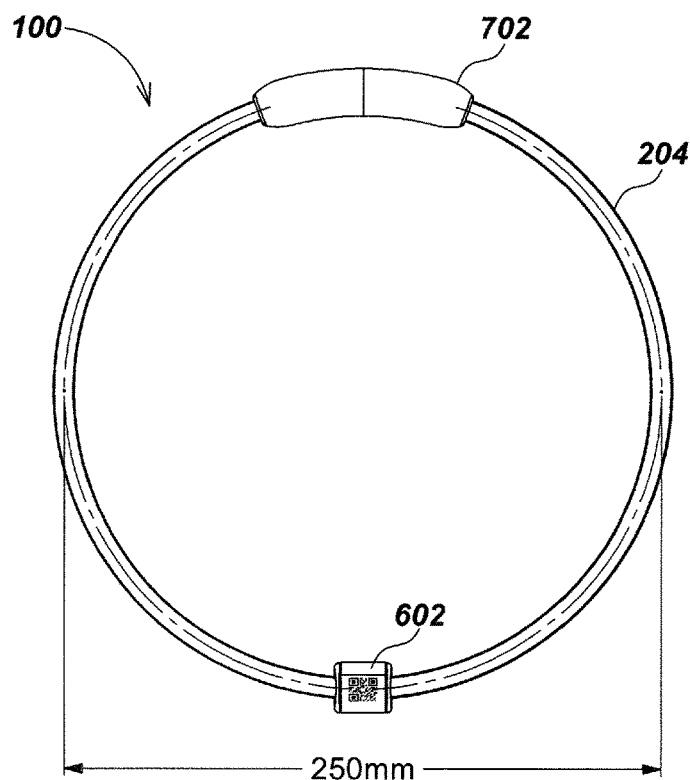

Further, dimensions of the marker device 100 may vary depending upon an underground environment and/or kind of object to be marked, and/or various other factors, and differently dimensioned marker devices may provide different signal reception and transmission range. By way of example and not as a limitation, illustrated in the FIG. 11A is the marker device 100 in loop-shape having three antenna coil turns and a diameter of about 100 mm, may provide a signal reception and transmission range of about 2.5 meters, while in FIG. 11B, the marker device with a diameter of about 250 mm may provide the signal reception and transmission range of about 3 meters.

Turning to the FIGS. 12A-12G, other embodiments of the marker device 100 and its use in a geographical survey is illustrated. According to these embodiments, the marker device 100 may include one or more permanent magnets attached to or disposed on the marker device 100 to facilitate detection by a survey instrument. For example, in a loop-shaped marker device embodiment shown in the FIGS. 12A-12B, the permanent magnet 1210 may be disposed in the snap lock connector having connector elements 604a and 604b locked together about the insulated housing 204 when mated. Alternatively, the permanent magnet 1210 and/or additional permanent magnet(s) may be disposed at other portions of the marker device 100.

Further, in a capsule or pin shaped configuration of the marker device 100 shown in the FIGS. 12C-12G, a pair of permanent magnets 1210 may be disposed at two opposing ends of the marker device 100 with the polarity of the magnets being aligned to each other. Alternatively, one or more permanent magnets may be disposed at other portions of the marker device 100. The permanent magnets may comprise ferrite magnet material. Such a capsule or pin shaped configuration of the marker device 100 may include an insulated housing 204 made of, for example, a fiberglass or other dielectric materials encapsulating a ferrite core 1220 having a plurality of coil turns 202 helically wrapped about the ferrite core 1220. Further encapsulated in the insulated housing 204 is an electronic circuit 206 which is electrically coupled to the coil turns 202. In one embodiment, any vacant space(s) inside the insulating housing may be filled with an epoxy resin, a silicon rubber, and/or other filler materials.

Figure 12A:
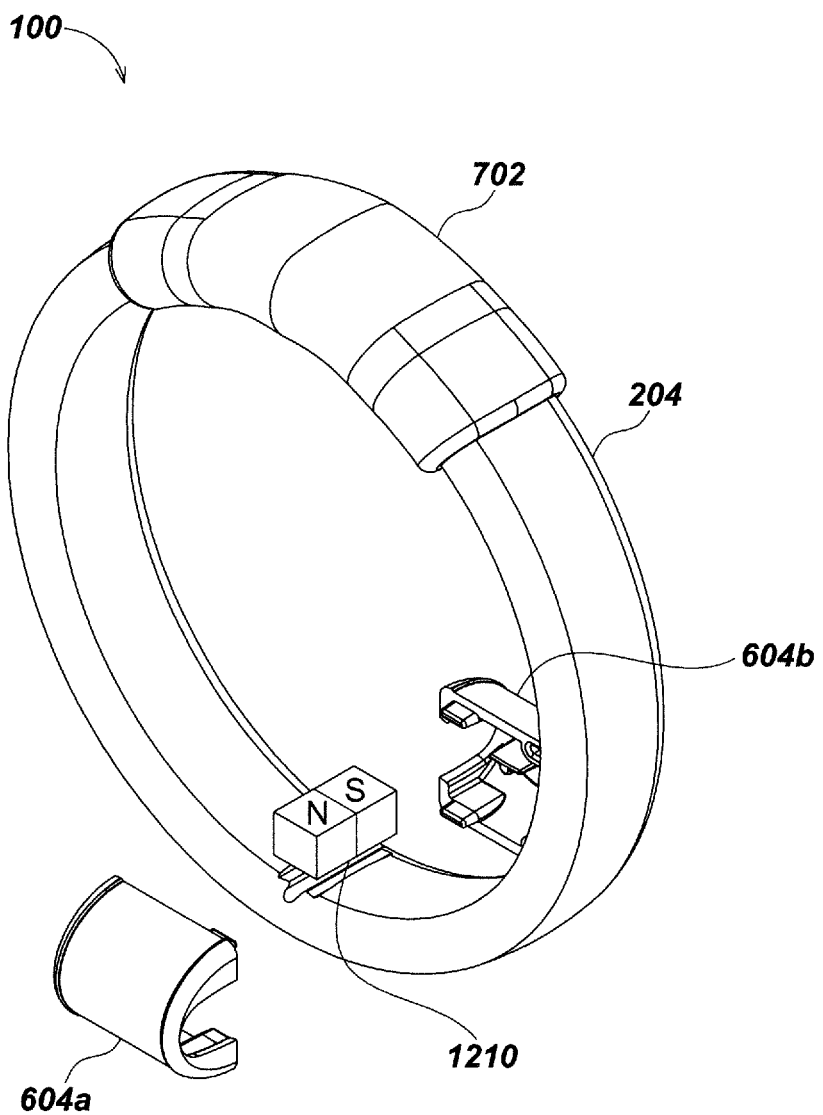
FIGS. 12A-12G illustrate embodiments of the enhanced marker device and its use in conducting surveys.
Figure 12B:
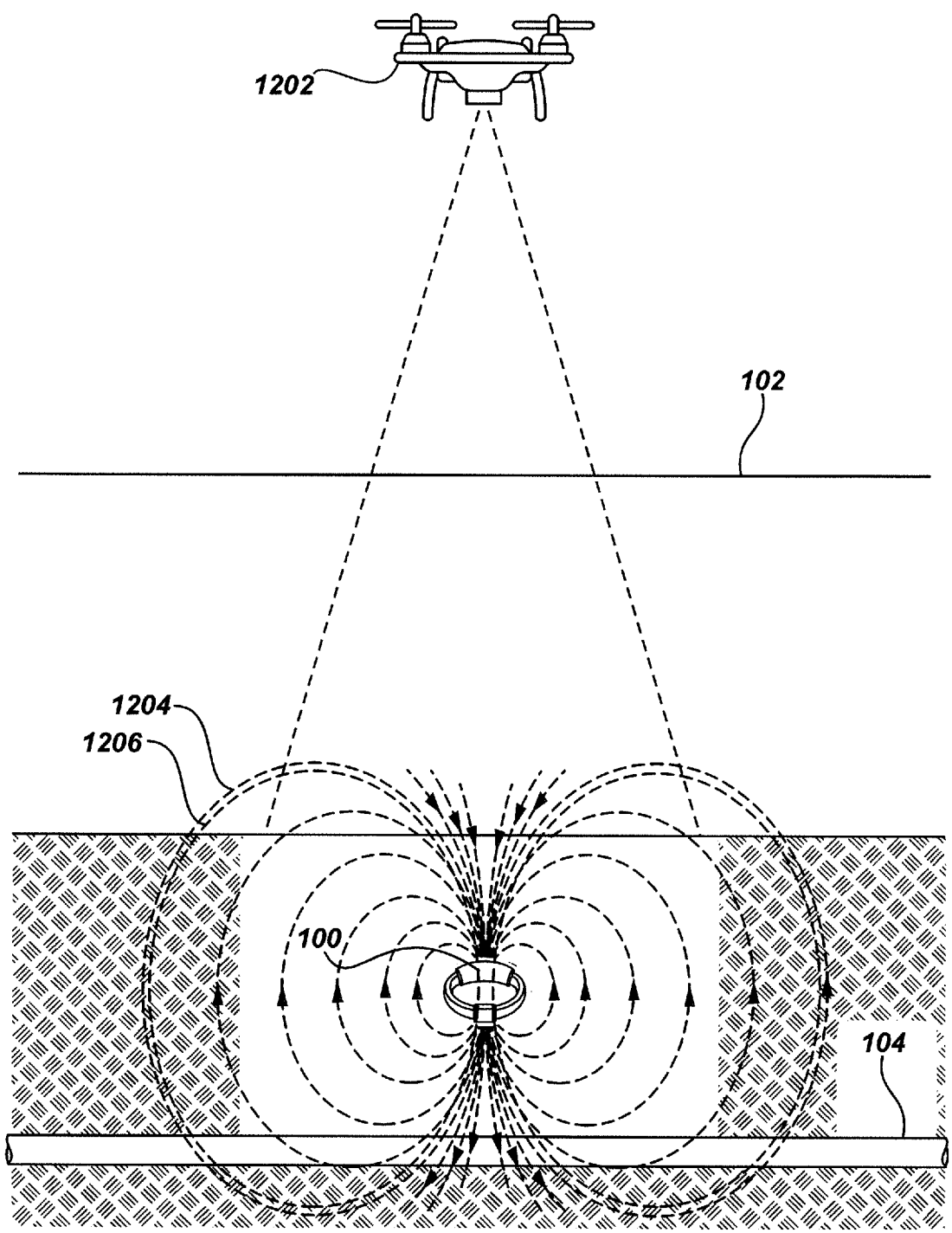
Figure 12C:
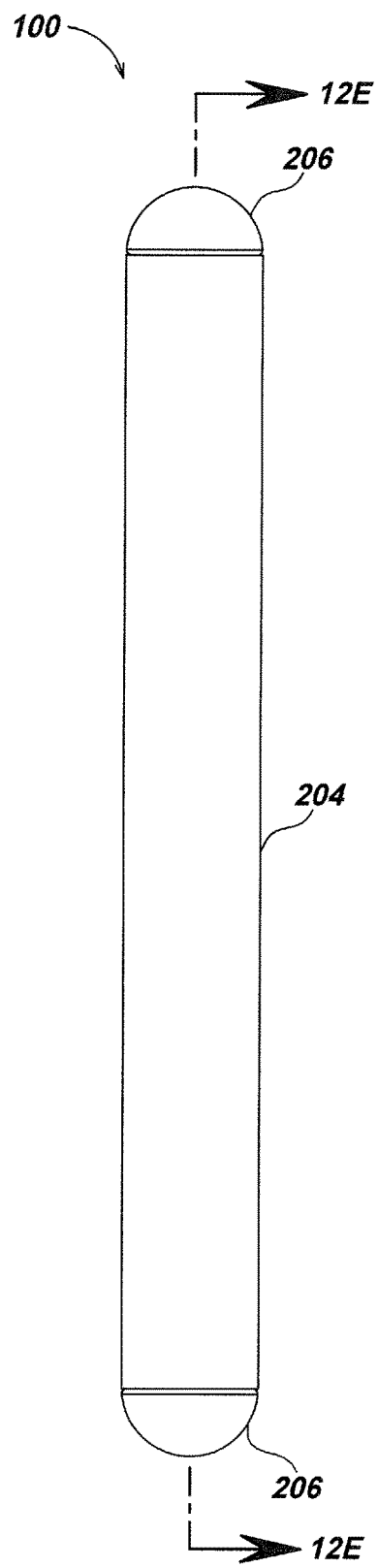
Figure 12D:
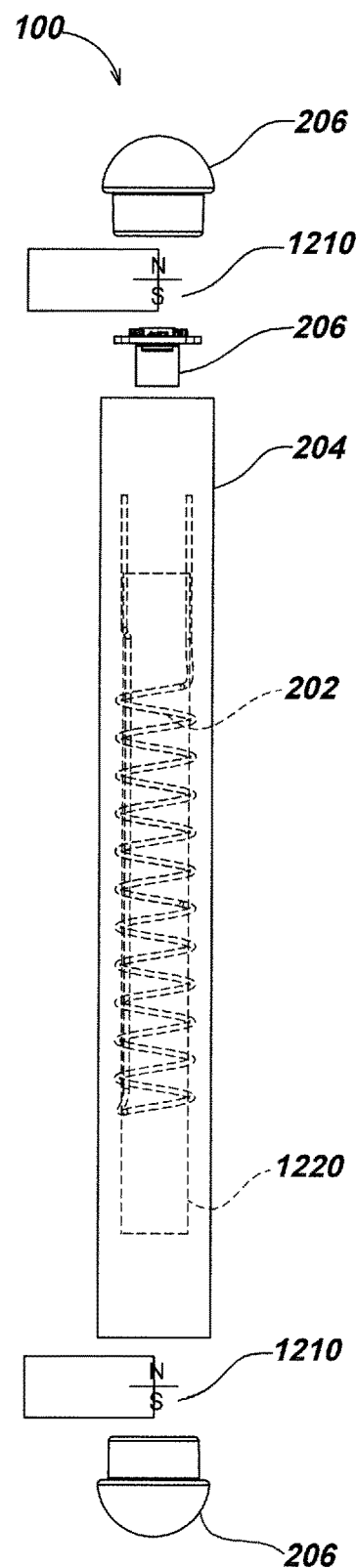
Figure 12E:
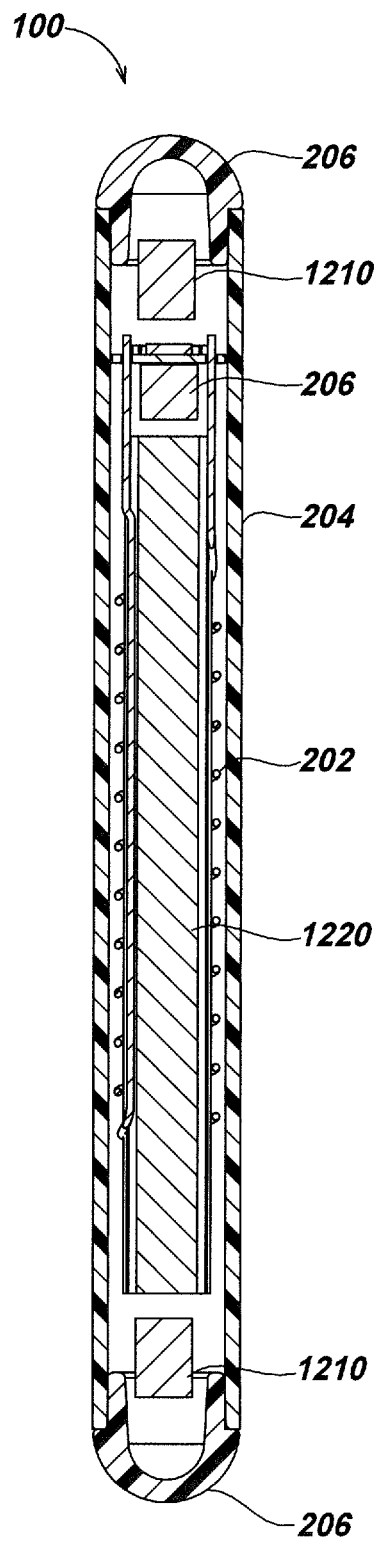
Figure 12F:
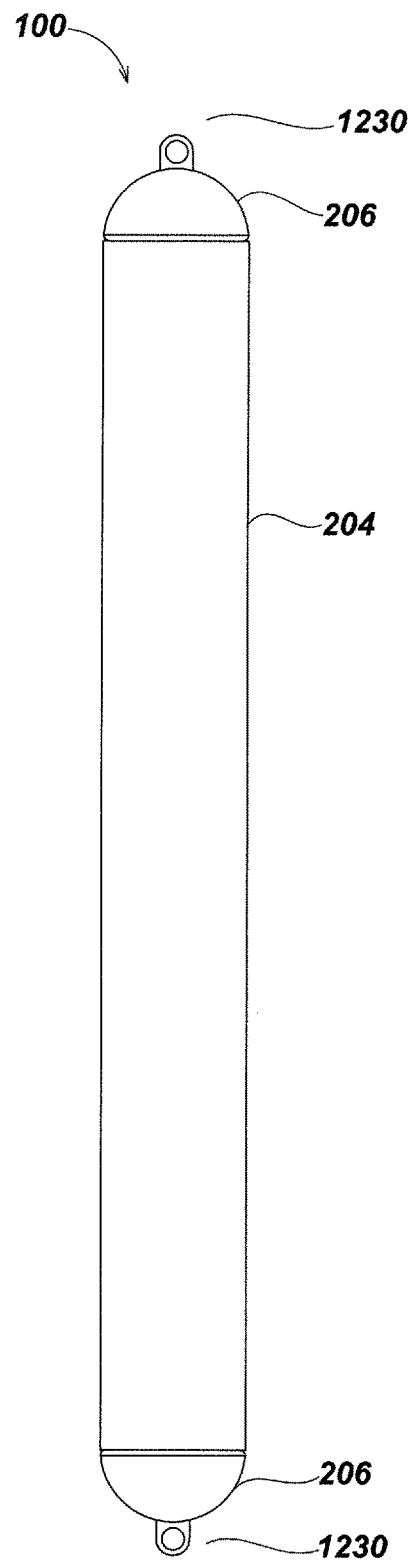
Figure 12G:
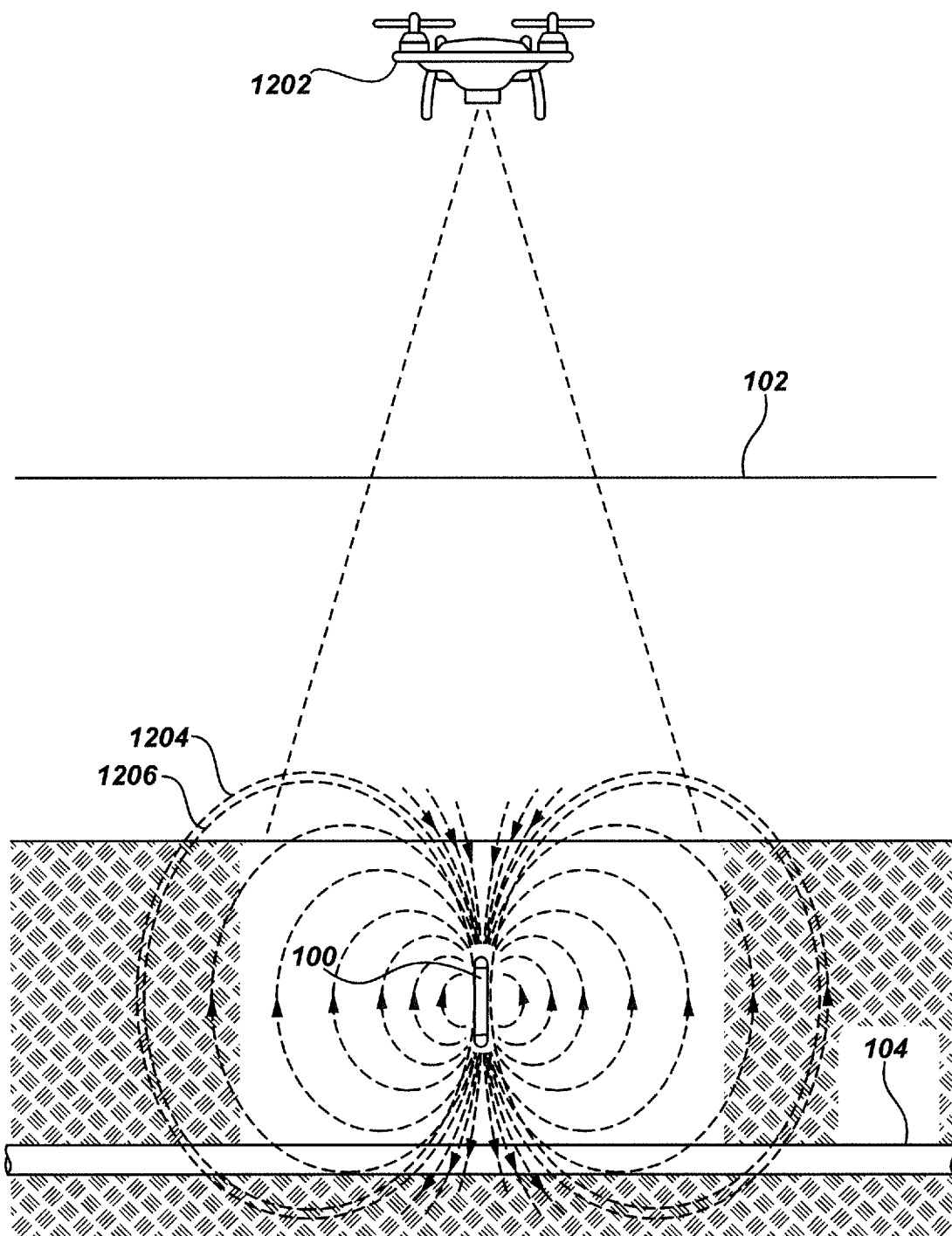

Ends of the insulating housing 204 may be covered by protective end pieces 206, which may be over-molded in the insulating housing 204 at two opposing ends to prevent ingress of liquid or other contaminants inside the housing 204 and protect the electronic circuit 206, coil turns 202 and other elements inside the insulating housing 204 from such contaminants and other contaminants in the underground environment. Shown in the FIG. 12E is a cross-sectional view of such capsule or pin shaped marker device 100. Further, shown in the FIG. 12F is another embodiment of the capsule or pin shaped marker device 100 with hooks 1230 disposed on the end pieces 206 for purposes including tying up a wire, string or cable to suspend, push, or pull the marker device 100 for placement/removal of the marker device 100 to/from the underground.

The magnets disposed in the marker device 100 generate magnetic fields, such as DC magnetic field 1204 in addition to the AC magnetic field 1206 generated by the marker device 100. These magnetic fields may be detectable by the survey instrument 1202 and/or one or more other survey instruments. The survey instrument 1202 may include any data collection instrument or a tool implementing a scientific protocol or executing a set of computer instructions, for obtaining data from respondent(s). The survey instrument 1202 may be, for example, a survey drone or other similar instruments known in the art, or it may be a buried object locator or another data collection instrument disclosed in the incorporated applications. In addition to the permanent magnets or in place of permanent magnets, other respondents or transponders known in the art may be utilized for enabling detection by the survey instrument 1202.

In one or more exemplary embodiments, the electronic features and functions described herein and associated with the marker device may be implemented in hardware, software, firmware, or any combination thereof. If implemented in software, the functions may be stored on or encoded as one or more instructions or code on a computer-readable medium. Computer-readable medium includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, solid state drives (SSD), USB flash drives or other similar portable devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable medium. As used herein, computer program products comprising computer-readable media include all forms of computer-readable media except to the extent that such media is deemed to be non-statutory, transitory propagating signals.

Those of skill in the art would understand that information and signals, such input/output signals or data, and/or other signals/other data may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Skilled artisans may implement the described functionality in varying ways for each particular application, but such implementation decisions should not be interpreted as causing a departure from the scope of the present disclosure.

The various illustrative functions and circuits described in connection with the embodiments disclosed herein may be implemented or performed in a processing element with a general purpose processor, a digital signal processor (DSP), an application specific integrated circuit (ASIC), a field programmable gate array (FPGA) or other programmable logic device, discrete gate or transistor logic, discrete hardware components, memory devices, and/or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The features described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known or developed in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in the marker device disclosed herein.

The scope of the presently claimed invention is not intended to be limited to the aspects shown and described previously herein, but should be accorded the full scope consistent with the description and drawings as reflected in the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use embodiments of the present invention. Various modifications to these aspects will be readily apparent to those skilled in the art, and the generic principles defined herein may be applied to other aspects without departing from the spirit or scope of the invention. Thus, the presently claimed invention is not intended to be limited to the aspects shown herein but is to be accorded the widest scope consistent with the appended claims and their equivalents.

We claim:

1. A marker device for locating a buried object, comprising:
   a housing made of a low dielectric constant (low K) material having a dielectric constant (K) less than 3 (three);
   an antenna element comprising a plurality of conductive windings enclosed in the housing; and
   an electronic circuit comprising a circuit board electrically coupled to the conductive windings through a connector, the connector including connecting elements at each side of the circuit board for coupling to outer ends of the conductive windings, wherein the circuit board includes electrical traces and the connecting elements electrically couple the conductive windings to the electrical traces in the circuit board, the circuit board comprising a plurality of circuit elements disposed thereon, the circuit elements including:
   an input circuit to receive, via the antenna element, an input signal from an above-ground transmitter, wherein the input signal has a first frequency;
   a power circuit to convert the input signal to a power supply for powering the electronic circuit; and
   a processing element to generate an output signal responsive to the input signal; and
   an output circuit to provide the output signal, via the antenna element, to an above-ground receiver to assist in determining a location of the buried object, wherein the output signal has a second frequency different from the first frequency, and wherein the conductive windings in conjunction with the electronic circuit are arranged in a configuration to provide a signal reception and transmission range of two meters or more;
   wherein a serial code is actively broadcasted at the second frequency as a response to the input signal reaching a certain power threshold.

2. The marker device of claim 1, wherein the serial code is an 8 bit serial number.

3. A marker device for locating a buried object, comprising:
   a housing;
   an antenna element comprising a plurality of conductive windings enclosed in the housing; and
   an electronic circuit comprising a circuit board electrically coupled to the outer ends of conductive windings, wherein the circuit board includes electrical traces that are electrically coupled to the conductive windings via the circuit board, the circuit board comprising a plurality of circuit elements disposed thereon, the circuit elements including:
   an input circuit to receive, via the antenna element, an input signal from an above-ground transmitter, wherein the input signal has a first frequency;
   a power circuit to convert the input signal to a power supply for powering the electronic circuit;
   a processing element to generate an output signal responsive to the input signal; and
   an output circuit to provide the output signal, via the antenna element, to an above-ground receiver to assist in determining a location of the buried object, wherein the output signal has a second frequency different from the first frequency;
   wherein the conductive windings in conjunction with the electronic circuit are arranged in a configuration to provide a signal reception and transmission range of two meters or more;
   wherein a serial code is actively broadcasted at the second frequency as a response to the input signal reaching a certain power threshold.

4. The marker device of claim 3, wherein the serial code is an 8 bit serial number.

5. The marker device of claim 1, wherein the antenna element comprises three conductive windings.

6. The marker device of claim 3, further comprising a protective cover over-molded on the electronic circuit and portions of the housing.

* * * * *